US012527209B2

(12) United States Patent
Kim et al.

(10) Patent No.: US 12,527,209 B2
(45) Date of Patent: Jan. 13, 2026

(54) DISPLAY DEVICE AND METHOD OF FABRICATING THE SAME

(71) Applicant: SAMSUNG DISPLAY CO., LTD., Yongin-si (KR)

(72) Inventors: Gyu Min Kim, Yongin-si (KR); Jong Oh Kim, Yongin-si (KR); Jong Hyun Park, Yongin-si (KR); Min Soo Seol, Yongin-si (KR); Hee Dong Choi, Yongin-si (KR); Tae Young Ham, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 379 days.

(21) Appl. No.: 18/337,237

(22) Filed: Jun. 19, 2023

(65) Prior Publication Data
US 2024/0130199 A1    Apr. 18, 2024

(30) Foreign Application Priority Data
Oct. 17, 2022   (KR) ......................... 10-2022-0133227

(51) Int. Cl.
*H10K 59/80*    (2023.01)
*H10K 59/12*    (2023.01)
(Continued)

(52) U.S. Cl.
CPC ....... *H10K 59/873* (2023.02); *H10K 59/1201* (2023.02); *H10K 59/1216* (2023.02);
(Continued)

(58) Field of Classification Search
CPC ............. H10K 59/873; H10K 59/1201; H10K 59/1216; H10K 59/122; H10K 59/126;
(Continued)

(56) References Cited

U.S. PATENT DOCUMENTS

2021/0134924 A1\*   5/2021   Ha ....................... H10K 59/122

FOREIGN PATENT DOCUMENTS

| JP | 2007194061 | 8/2007 |
| KR | 10-2014-0082479 | 7/2014 |

(Continued)

*Primary Examiner* — James R Greece
*Assistant Examiner* — Jose M Diaz
(74) *Attorney, Agent, or Firm* — F. CHAU & ASSOCIATES, LLC

(57) ABSTRACT

A display device includes a first substrate and a second substrate facing each other; and a filling layer disposed between the first substrate and the second substrate. The first substrate comprises a support substrate comprising a display area in which emission areas associated with sub-pixels, are arranged; a light-emitting element layer disposed on one surface of the support substrate; and an encapsulation layer disposed on the light-emitting element layer. The encapsulation layer comprises a first inorganic layer covering the light-emitting element layer; an organic layer disposed on the first inorganic layer and overlapping the light-emitting element layer; and a second inorganic layer disposed on the first inorganic layer and covering the organic layer. A thickness of the first inorganic layer is smaller than a thickness of the second inorganic layer.

20 Claims, 30 Drawing Sheets

(51) Int. Cl.
*H10K 59/121* (2023.01)
*H10K 59/122* (2023.01)
*H10K 59/126* (2023.01)
*H10K 59/131* (2023.01)
*H10K 59/38* (2023.01)
*H10K 71/10* (2023.01)
*H10K 102/00* (2023.01)

(52) U.S. Cl.
CPC ......... *H10K 59/122* (2023.02); *H10K 59/126* (2023.02); *H10K 59/131* (2023.02); *H10K 59/38* (2023.02); *H10K 59/8723* (2023.02); *H10K 71/191* (2023.02); *H10K 2102/351* (2023.02)

(58) Field of Classification Search
CPC .. H10K 59/131; H10K 59/38; H10K 59/8723; H10K 59/8792; H10K 59/12; H10K 59/35; H10K 71/191; H10K 71/00; H10K 71/50; H10K 2102/351; H10K 50/8426; H10K 50/11; H10K 50/81; H10K 50/82; H10K 50/865
See application file for complete search history.

(56) References Cited

FOREIGN PATENT DOCUMENTS

| | | |
|---|---|---|
| KR | 10-2014-0102565 | 8/2014 |
| KR | 10-1818480 | 1/2018 |
| KR | 10-2333517 | 12/2021 |

\* cited by examiner

DISPLAY DEVICE AND METHOD OF FABRICATING THE SAME

This application claims priority from Korean Patent Application No. 10-2022-0133227 filed on Oct. 17, 2022, in the Korean Intellectual Property Office, the disclosure of which is incorporated herein by reference in its entirety.

BACKGROUND

1. Field of the Disclosure

The present disclosure relates to a display device and a method of fabricating the same.

2. Description of the Related Art

As the information-oriented society evolves, various demands for display devices are ever increasing. For example, display devices are being employed by a variety of electronic devices such as smart phones, digital cameras, laptop computers, navigation devices, and smart televisions.

Display devices may be flat panel display devices such as a liquid-crystal display device, a field emission display device, and a light-emitting display device. Light-emitting display devices may include an organic light-emitting display device including an organic light-emitting element, an inorganic light-emitting display device including an inorganic light-emitting element such as an inorganic semiconductor, and a micro-light-emitting display device including an ultra-small light-emitting element.

An organic light-emitting display device displays images by using light-emitting elements each including an emissive layer of an organic material. As an organic light-emitting display device displays images by using self-luminous elements, it can exhibit superior performance in power consumption, response speed, emission efficiency, luminance, and wide viewing angle, etc.

SUMMARY

An organic light-emitting display device includes an encapsulation layer that encapsulates light-emitting elements in order to retard the deterioration of organic materials due to oxygen or moisture.

Such an encapsulation layer may include inorganic layers of an inorganic insulating material and an organic layer interposed between the inorganic layers and made of an organic insulating material.

Incidentally, before the organic layer is disposed, a process of removing foreign matters remaining above the light-emitting elements may be carried out. Unfortunately, the inorganic layer covering the light-emitting elements also covers foreign matters above the light-emitting elements. Accordingly, the foreign matters may be more firmly adhered by the inorganic layer, and thus the foreign matters may remain without being removed.

Such foreign matters remaining on the light-emitting elements may break the encapsulation layer to form a permeation path of oxygen or moisture. As a result, the light-emitting elements may deteriorate earlier. In addition, the remaining foreign matter may apply a physical impact on some regions, and thus the light-emitting elements may be damaged.

Aspects of the present disclosure provide a display device that can reduce foreign matter remaining on light-emitting elements, and a method of fabricating the same.

According to an embodiment, a display device comprises a first substrate and a second substrate facing each other; and a filling layer disposed between the first substrate and the second substrate. The first substrate comprises a support substrate comprising a display area in which emission areas associated with sub-pixels, respectively, are arranged; a light-emitting element layer disposed on one surface of the support substrate and comprising light-emitting elements respectively disposed in the emission areas; and an encapsulation layer disposed on the light-emitting element layer. The encapsulation layer comprises a first inorganic layer disposed on the light-emitting element layer, covering the light-emitting element layer and comprising a first inorganic insulating material; an organic layer disposed on the first inorganic layer, overlapping the light-emitting element layer, and comprising an organic insulating material; and a second inorganic layer disposed on the first inorganic layer, covering the organic layer, and comprising a second inorganic insulating material. A portion of the second inorganic insulating material contains hydrogen atoms. A thickness of the first inorganic layer is smaller than a thickness of the second inorganic layer. The first inorganic insulating material and the second inorganic insulating material are the same in kind.

The thickness of the first inorganic layer is equal to or less than approximately 0.3 μm, and the thickness of the second inorganic layer is selected from a range of approximately 0.7 μm to approximately 1.2 μm.

The first inorganic layer comprises a first sub-layer disposed on the light-emitting element layer; an assisting layer disposed on the first sub-layer; and a second sub-layer disposed on the assisting layer. The first sub-layer, the assisting layer, and the second sub-layer include the second inorganic insulating material. The portion of the second inorganic insulating material corresponds to the assisting layer. The second inorganic insulating material of the assisting layer contains the hydrogen atoms. A number of hydrogen (H) atoms in the assisting layer is greater than the first sub-layer and the second sub-layer.

The thickness of the first inorganic layer is equal to or greater than approximately 0.05 μm.

A thickness of the organic layer is selected from a range of approximately 2.0 μm to approximately 4.0 μm.

The filling layer overlaps at least the display area, and a thickness of the filling layer is selected from a range of approximately 4 μm to approximately 5 μm.

The display device further comprises a sealing layer for attaching the first substrate to the second substrate. The sealing layer is disposed between the first substrate and the second substrate, is disposed on a non-display area of the support substrate surrounding the display area, and is spaced apart from the filling layer.

The emission areas comprise a first emission area emitting light of a first color, a second emission area emitting light of a second color in a wavelength range lower than that of the first color, and a third emission area emitting light of a third color in a wavelength range lower than that of the second color. The light-emitting element layer comprises an anode electrode disposed in each of the emission areas; a pixel-defining layer disposed around each of the emission areas; an emissive layer disposed on the anode electrode and the pixel-defining layer; and a cathode electrode disposed on the emissive layer. In each of the light-emitting elements, the emissive layer is interposed between the anode electrode and the cathode electrode facing each other. Each of the light-emitting elements emits light of the third color.

The second substrate comprises an encapsulation substrate facing the support substrate that includes the display area; a color filter layer disposed on one surface of the encapsulation substrate; a first capping layer covering the color filter layer; a color conversion layer disposed on the first capping layer; a second capping layer covering the color conversion layer; and a low-refractive layer disposed between the color filter layer and the color conversion layer and comprising a material having a lower refractive index than that of the color conversion layer.

The color conversion layer comprises a bank portion disposed around each of the emission areas; a first color conversion portion disposed in the first emission area and converting light of the third color emitted from the light-emitting elements of the first emission area into light of the first color; a second color conversion portion disposed in the second emission area and converting light of the third color emitted from the light-emitting elements of the second emission area into light of the second color; and a transparent portion disposed in the third emission area and transmitting light of the third color emitted from the light-emitting elements of the third emission area.

The color filter layer comprises a light-blocking portion disposed in a peripheral area between the emission areas; a first color filter portion disposed in the first emission area and transmitting light of the first color; a second color filter portion disposed in the second emission area and transmitting light of the second color; and a third color filter portion disposed in the third emission area and transmitting light of the third color.

According to an embodiment, a method of fabricating a display device comprises preparing a first substrate; preparing a second substrate; disposing a sealing layer on one of the first substrate and the second substrate; aligning the first substrate and the second substrate with each other; and attaching the first substrate to the second substrate using the sealing layer. The preparing the first substrate comprises preparing a support substrate comprising a display area in which emission areas associated with sub-pixels, respectively, are arranged; disposing a circuit layer comprising pixel drivers associated with the sub-pixels, respectively, on one surface of the support substrate; disposing a light-emitting element layer comprising light-emitting elements disposed in each of the emission areas on the circuit layer; disposing a first inorganic layer comprising an inorganic insulating material on the light-emitting element layer; disposing an organic layer overlapping the light-emitting element layer and comprising an organic insulating material on the first inorganic layer; and disposing a second inorganic layer covering the organic layer and comprising the inorganic insulating material on the first inorganic layer. A thickness of the first inorganic layer is equal to or less than approximately 0.3 µm, and a thickness of the second inorganic layer is selected from a range of approximately 0.7 µm to approximately 1.2 µm.

The disposing the first inorganic layer comprises disposing a first sub-layer covering the light-emitting element layer; disposing an assisting layer by performing hydrogen (H2) plasma treatment on a surface of the first sub-layer; and disposing a second sub-layer on the assisting layer.

The assisting layer comprises a greater number of hydrogen (H) atoms than each of the inorganic insulating material of the first sub-layer and the inorganic insulating material of the second sub-layer.

The thickness of the first inorganic layer is equal to or greater than approximately 0.05 µm.

A thickness of the organic layer is selected from a range of approximately 2.0 µm to approximately 4.0 µm.

The method further comprises dropping a filling material onto the second substrate prior to the disposing the sealing layer. The filling material is diffused to overlap at least the display area, thereby forming a filling layer that attaches the first substrate to the second substrate. A thickness of the filling layer is selected from a range of approximately 4 µm to approximately 5 µm.

The preparing the first substrate further comprises removing foreign matters on the light-emitting element layer prior to the disposing the organic layer.

The disposing the light-emitting element layer comprises disposing an anode electrode in each of the emission areas on the circuit layer; disposing a pixel-defining layer on the circuit layer around each of the emission areas; disposing an emissive layer on the anode electrode and the pixel-defining layer; and disposing a cathode electrode on the emissive layer. In each of the light-emitting elements, the emissive layer is interposed between the anode electrode and the cathode electrode facing each other. The emission areas comprise a first emission area emitting light of a first color, a second emission area emitting light of a second color in a wavelength range lower than that of the first color, and a third emission area emitting light of a third color in a wavelength range lower than that of the second color. Each of the light-emitting elements emits light of the third color.

The preparing the second substrate comprises preparing an encapsulation substrate comprising the display area; disposing a color filter layer on one surface of the encapsulation substrate; disposing a first capping layer covering the color filter layer; disposing a color conversion layer on the first capping layer; and disposing a second capping layer covering the color conversion layer. The color filter layer comprises a light-blocking portion disposed around each of the emission areas; a first color filter portion disposed in the first emission area and transmitting light of the first color; a second color filter portion disposed in the second emission area and transmitting light of the second color; and a third color filter portion disposed in the third emission area and transmitting light of the third color. The color conversion layer comprises a bank portion disposed around each of the emission areas; a first color conversion portion disposed in the first emission area and converting light of the third color emitted from the light-emitting elements of the first emission area into light of the first color; a second color conversion portion disposed in the second emission area and converting light of the third color emitted from the light-emitting elements of the second emission area into light of the second color; and a transparent portion disposed in the third emission area and transmitting light of the third color emitted from the light-emitting elements of the third emission area. The preparing the second substrate further comprises disposing a low-refractive layer comprising a material having a lower refractive index than that of the color conversion layer between the disposing the color filter layer and the disposing the color conversion layer.

According to an embodiment, a display device includes an encapsulation layer disposed on light-emitting elements. The encapsulation layer includes a first inorganic layer disposed on the light-emitting elements, an organic layer on the first inorganic layer, and a second inorganic layer covering the organic layer. The first inorganic layer has a thickness smaller than that of the second inorganic layer.

As described above, since the first inorganic layer directly covering the light-emitting element layer has a relatively small thickness, it is possible to prevent foreign matters above the light-emitting element layer from being more strongly adhered by the first inorganic layer. In other words, as the first inorganic layer has a smaller thickness, the foreign matters may be fixed above the light-emitting element layer with a relatively weak adhesive force. Therefore, it is possible to remove the foreign matters from the light-emitting element layer relatively easily via a cleaning process with a weaker intensity.

Accordingly, the foreign matters remaining on the light-emitting element layer can be reduced, and thus rapid deterioration and/or damage of the light-emitting elements due to the foreign mattes can be suppressed. As a result, the display quality and lifetime of the display device can be improved.

In addition, according to an embodiment, the first inorganic layer may include a first sub-layer and a second sub-layer made of the same inorganic insulating material, and an assisting layer disposed between the first sub-layer and the second sub-layer. Since the assisting layer includes a greater content of hydrogen (H) than the first sub-layer and the second sub-layer, it may have stronger hydrophobicity than the first sub-layer and the second sub-layer.

As described above, since the first inorganic layer has the structure including the assisting layer between the first sub-layer and the second sub-layer, it is possible to avoid the encapsulation function and the function of blocking moisture by the first inorganic layer from becoming weak even though it has a relatively small thickness.

Therefore, it is possible to prevent the deterioration of the display quality and a decrease in the lifetime of the display device.

The effects of the present disclosure are not limited to the aforementioned effects, and various other effects are included in the present specification.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION OF THE EMBODIMENTS

Figure 1:
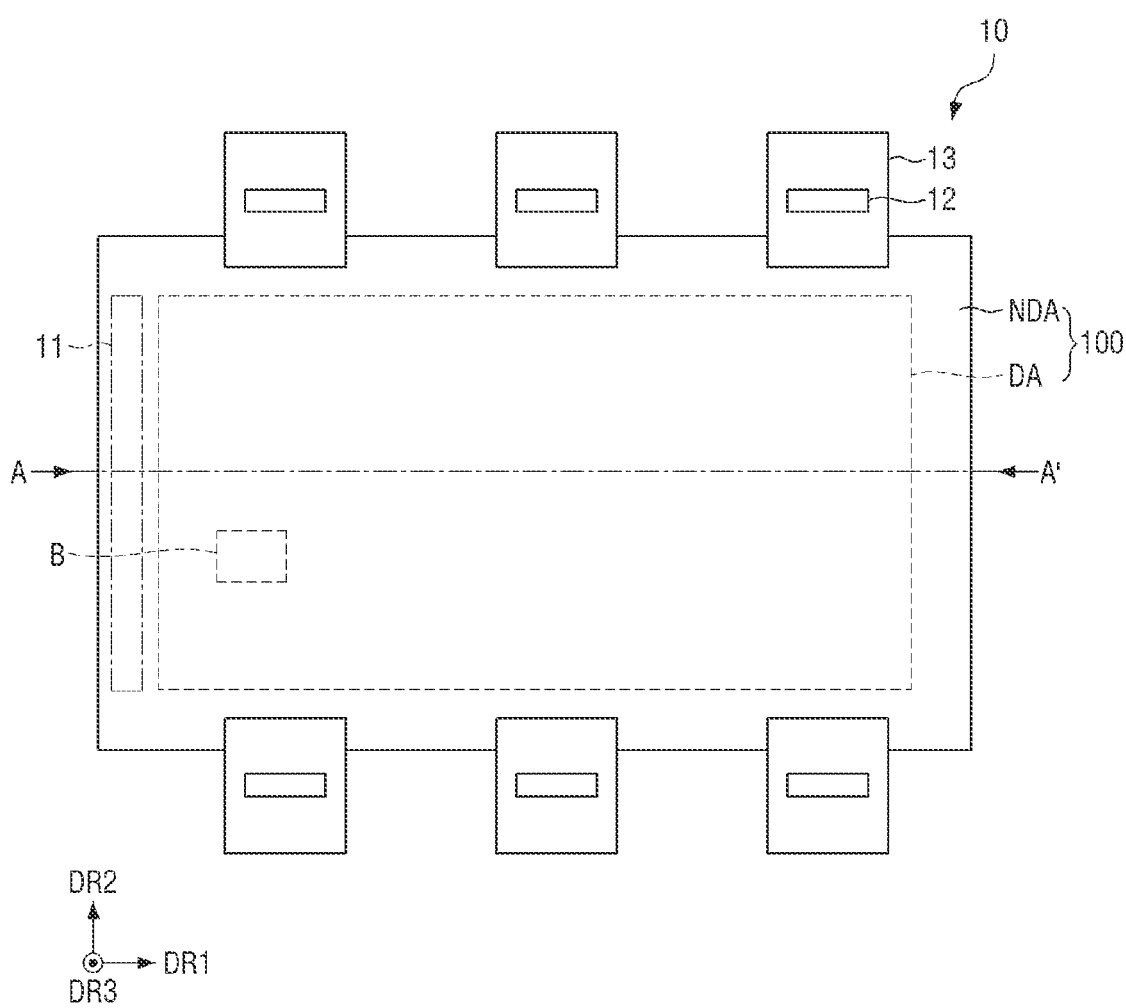
FIG. 1 is a plan view showing a display device according to an embodiment of the present disclosure.

The embodiments will now be described more fully hereinafter with reference to the accompanying drawings. The embodiments may, however, be provided in different forms and should not be construed as limiting. The same reference numbers indicate the same components throughout the disclosure. In the accompanying figures, the thickness of layers and regions may be exaggerated for clarity.

Some of the parts which are not associated with the description may not be provided in order to describe embodiments of the disclosure.

It will also be understood that when a layer is referred to as being "on" another layer or substrate, it can be directly on the other layer or substrate, or intervening layers may also be present. In contrast, when an element is referred to as being "directly on" another element, there may be no intervening elements present.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

The spatially relative terms "below," "beneath," "lower," "above," "upper," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element is referred to as being "connected" or "coupled" to another element, the element may be "directly connected" or "directly coupled" to another element, or "electrically connected" or "electrically coupled" to another element with one or more intervening elements interposed therebetween. It will be further understood that when the terms "comprises," "comprising," "has," "have," "having," "includes" and/or "including" are used, they may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Hereinafter, embodiments of the present disclosure will be described in detail with reference to the accompanying drawings.

FIG. 1 is a plan view showing a display device according to an embodiment of the present disclosure.

A display device 10 according to the embodiment of the present disclosure is for displaying moving images or still images. The display device 1 may be used as the display screen of portable electronic devices such as a mobile phone, a smart phone, a tablet PC, a smart watch, a watch phone, a mobile communications terminal, an electronic notebook, an electronic book, a portable multimedia player (PMP), a navigation device and a ultra mobile PC (UMPC), as well as the display screen of various products such as a television, a notebook, a monitor, a billboard and the Internet of Things.

The display device 10 may be a light-emitting display device such as an organic light-emitting display device using organic light-emitting diodes, an inorganic light-emitting display device including an inorganic semiconductor, and a micro light-emitting display device using micro or nano light-emitting diodes (micro LEDs or nano LEDs).

According to an embodiment, the display device 10 may be an organic light-emitting display device.

Referring to FIG. 1, the display device 10 according to the embodiment may include a display panel 100 on which images are displayed, and drivers 11 and 12 that supply a variety of signals or voltages for driving the display panel 100.

The display panel 100 may be in the form of a flat plate. As in the example of FIG. 1, the display panel 100 may have a rectangular shape, but the display panel 100 according to the embodiment is not limited to that shown in FIG. 1. For example, the display panel 100 according to the embodiment may have a polygonal shape other than a rectangular shape or a circular shape. In addition, the display panel 100 may be formed to be flexible so that it can be curved, bent, folded or rolled.

At least one surface of the display panel 100 may be a display surface where images are displayed. For example, the display panel 100 may include a display surface on one side, or display surfaces on one side and the opposite surface, respectively.

The display surface may include a display area DA from which light for image display exits, and a non-display area NDA surrounding the display area DA.

The display area DA may occupy most of the center of the display surface of the display panel 100.

In the non-display area NDA, no image may be displayed. The non-display area NDA may remain with a particular color such as black. The non-display area NDA may have a frame shape surrounding the display area DA.

One of the drivers 11 and 12 may be incorporated into the display panel 100.

In addition, the other one of the drivers 11 and 12 may be implemented as an integrated circuit chip and may be mounted on a flexible circuit board 13 electrically connected to the display panel 100.

Figure 2:
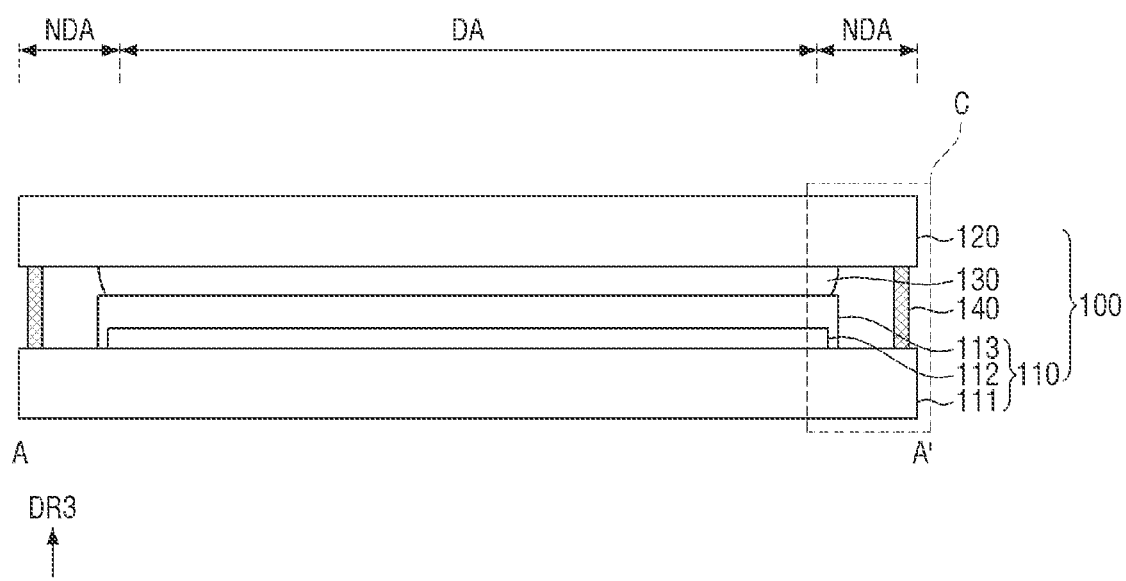
FIG. 2 is a cross-sectional view taken along line A-A' of FIG. 1.

FIG. 2 is a cross-sectional view taken along line A-A' of FIG. 1.

Referring to FIG. 2, the display panel 100 of the display device 10 according to the embodiment includes a first substrate 100 and a second substrate 120 facing each other, and a filling layer 130 disposed between the first substrate 100 and the second substrate 120.

In addition, the display panel 100 of the display device 10 may further include a sealing layer 140 for attaching the first substrate 110 to the second substrate 120.

The first substrate 110 includes a support substrate 111 including the display area DA, a light-emitting element layer 112 disposed on one surface of the support substrate 111, and an encapsulation layer 113 disposed on the light-emitting element layer 112. The support substrate 111 may include the non-display area NDA surrounding the display area DA.

The filling layer 130 may be located at least in the display area DA. For example, the filling layer 130 may be formed of a filling material used to fill the space between the first substrate 110 and the second substrate 120 at least in the display area DA.

The sealing layer 140 is disposed between the first substrate 110 and the second substrate 120 and may be in line with the non-display area NDA. For example, the sealing layer 140 may be disposed on the non-display area NDA of the support substrate 111. Accordingly, the sealing layer 140 may be spaced apart from the filling layer 130.

The sealing layer 140 may include an adhesive material. For example, the sealing layer 140 may be formed of an epoxy-based resin.

Figure 3:
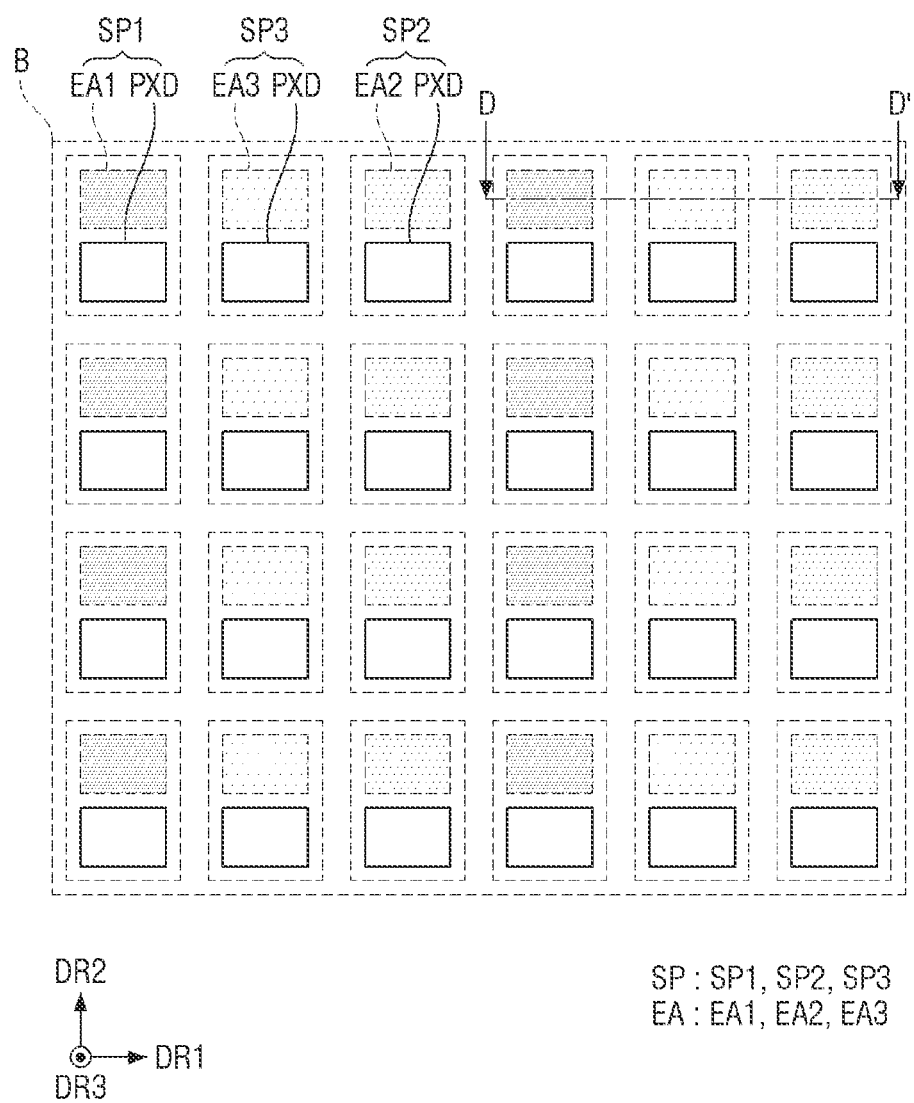
FIG. 3 is a layout view showing portion B of FIG. 1.

FIG. 3 is a layout view showing portion B of FIG. 1.

Referring to FIG. 3, according to the embodiment, emission areas EA respectively associated with the sub-pixels SP are located in the display area DA of the display device 10.

For example, the emission areas EA may be arranged in parallel to one another in the first direction DR1 and/or the second direction DR2.

Each of the sub-pixels SP may be a unit with the color and luminance that can be controlled individually.

Each of the sub-pixels SP may include an emission area EA from which light of a predetermined color exits, and a pixel driver PXD for driving the emission area EA with a luminance associated with an image signal.

The emission areas EA may include first emission areas EA1 emitting light of a first color; second emission areas EA2 emitting light of a second color in a wavelength band lower than that of the first color; and third emission areas EA3 emitting light of a third color in a wavelength band lower than that of the second color.

In this instance, the sub-pixels SP may include first sub-pixels SP1 including the first emission areas EA1, second sub-pixels SP2 including the second emission areas EA2, and third sub-pixels SP3 including the third emission areas EA3.

For example, the first color may be red, the second color may be green, and the third color may be blue. It should be understood, however, that the present disclosure is not limited thereto. The first, second and third colors according to the embodiment are not limited thereto.

Referring to FIG. 3, the emission areas EA have the same width. It should be understood, however, that this is merely illustrative. At least one of the first emission areas EA1, the second emission areas EA2 and the third emission areas EA3 may have a different width than the others. For example, the second emission areas EA2 may have the smallest width, while the third emission areas EA3 may have the greatest width.

Referring to FIG. 3, each of the emission areas EA has a rectangular shape. It should be understood, however, that the present disclosure is not limited thereto. The shape of each of the emission areas EA according to an embodiment may be selected from among a variety of shapes such as a triangle, a diamond, a square, a trapezoid, a circle and an oval in addition to a rectangle.

In addition, referring to FIG. 2, the first emission areas EA1, the third emission areas EA3 and the second emission areas EA2 are arranged side-by-side repeatedly in this order in the first direction DR1. It should be understood, however, that this is merely illustrative. The arrangement of the emission areas EA according to an embodiment is not limited to that shown in FIG. 2. For example, the first emission areas EA1 and the third emission areas EA3 are repeatedly arranged in parallel in the first direction DR1, and the second emission areas EA are arranged in parallel in the first direction DR1, and may be adjacent to the first emission area EA1 and the third emission area EA3 in the second direction DR2.

One first sub-pixel SP1, one second sub-pixel SP2 and one third sub-pixel SP3 adjacent to one another among the sub-pixels SP may be included in each of a pixel (not shown) which is a unit for displaying white light.

Figure 4:
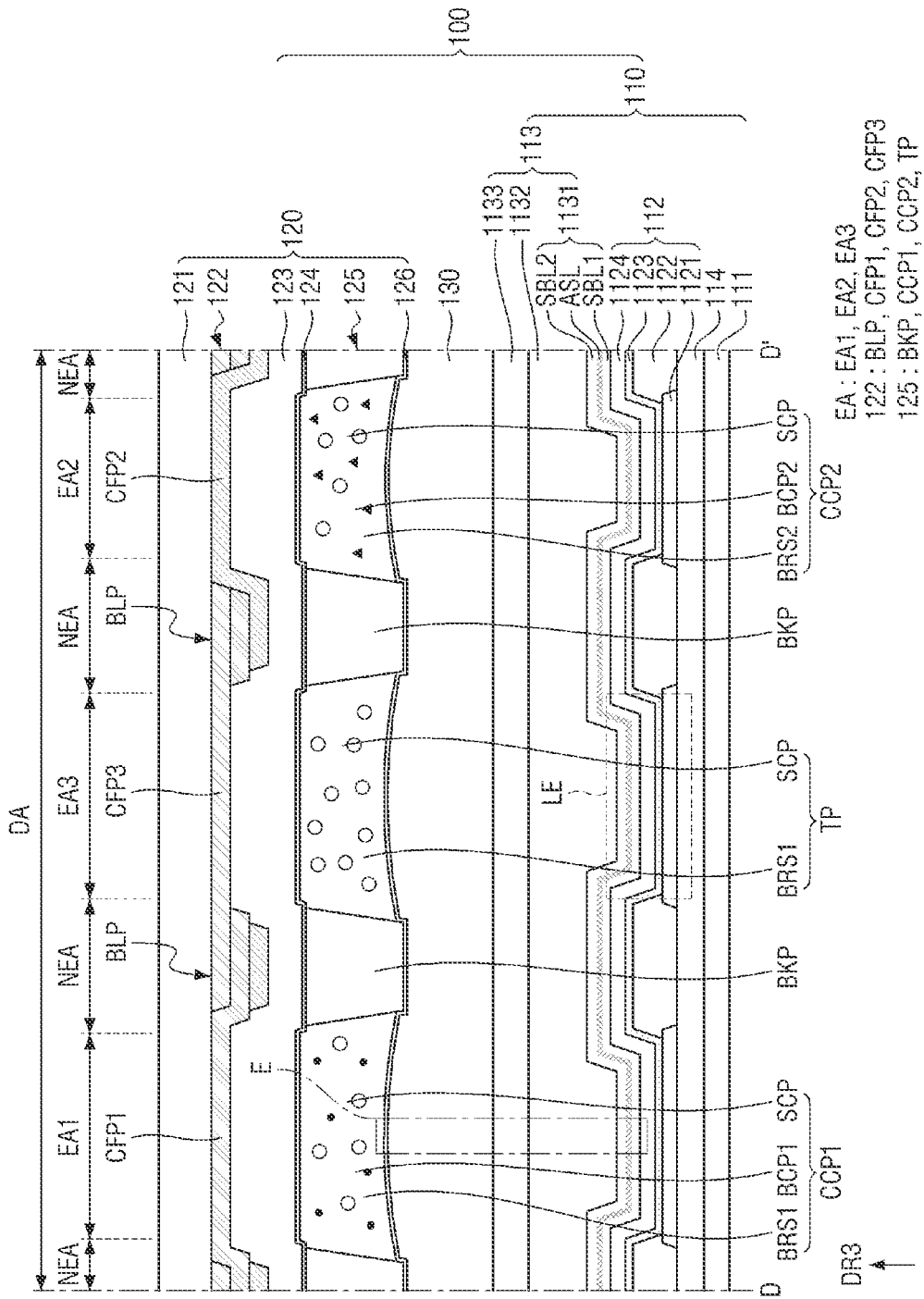
FIG. 4 is a cross-sectional view taken along line D-D' of FIG. 3.
Figure 5:
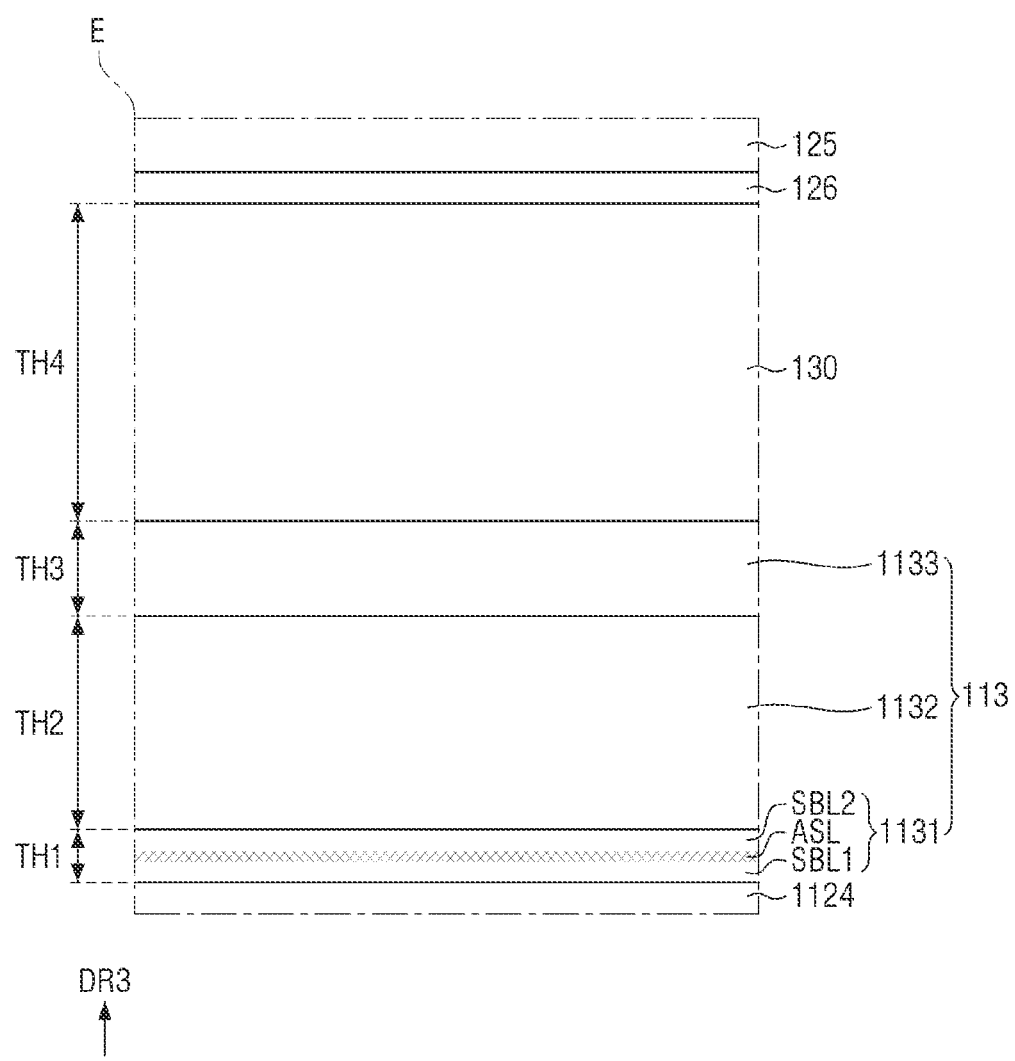
FIG. 5 is an enlarged view of portion E of FIG. 4.

FIG. 4 is a cross-sectional view taken along line D-D' of FIG. 3. FIG. 5 is an enlarged view of portion E of FIG. 4.

Referring to FIG. 4, the display panel 100 of the display device 10 according to the embodiment includes a first substrate 100 and a second substrate 120 facing each other, and a filling layer 130 used to fill the space between the first substrate 100 and the second substrate 120.

The first substrate 110 includes the support substrate 111 including a display area DA in which emission areas EA: EA1, EA2 and EA3 associated with the sub-pixels SP (see FIG. 3), respectively, are arranged; the light-emitting element layer 112 disposed on one surface of the support substrate 111 and including the light-emitting elements LE associated with the emission areas EA, respectively; and the encapsulation layer 113 disposed on the light-emitting element layer 112.

In addition, the first substrate 110 may further include a circuit layer 114 that is disposed on one surface of the support substrate 111 and includes pixel drivers PXD (see FIG. 3) associated with the sub-pixels SP (see FIG. 3), respectively. For example, the circuit layer 114 may be disposed between the surface of the support substrate 111 and the light-emitting element layer 112.

The support substrate 111 may be an insulating substrate. The support substrate 111 may be made of a transparent and rigid material.

For example, the support substrate 111 may include a transparent insulating material such as glass and quartz. It should be understood, however, that this is merely illustrative. The support substrate 111 according to an embodiment may be made of a flexible material, a conductive material, or an opaque material. For example, the support substrate 111 may be made of a plastic material having flexibility so that it can be bent, folded, or rolled, such as polyimide.

The light-emitting element layer 112 may include an anode electrode 1121 disposed in each of the emission areas EA; a pixel-defining layer 1122 disposed in a non-emission area NEA surrounding each of the emission areas EA; an emissive layer 1123 disposed on the anode electrode 1121 and the pixel-defining layer 1122; and a cathode electrode 1124 disposed on the emissive layer 1123.

Accordingly, the light-emitting elements LEL associated with each of the emission areas EA may have a structure in which the emissive layer 1124 is interposed between the anode electrode 1121 and the cathode electrode 1123 facing each other.

According to the embodiment of the present disclosure, as the emissive layer 1123 is disposed across the emission areas EA, the light-emitting elements LE may emit light of the same color.

Specifically, the light-emitting elements LE may emit light of the third color in the lowest wavelength range among the first color, the second color, and the third color.

The anode electrode 1121 may be a pixel electrode located in the emission area EA of each of the sub-pixels SP.

The anode electrode 1121 may have a structure in which a material layer having a high work function and a reflective material layer are stacked on one another. The material layer having a high work function may be disposed closer to the emissive layer 1123 than the reflective material layer is.

The material layer with a high work function may be selected as at least one of indium-tin-oxide (ITO), indium-zinc-oxide (IZO), zinc oxide (ZnO), and indium oxide ($In_2O_3$).

The reflective material layer may be selected as at least one of silver (Ag), magnesium (Mg), aluminum (Al), platinum (Pt), lead (Pb), palladium Pd, gold (Au), nickel (Ni), neodymium (Nd), iridium (Ir), chrome (Cr), lithium (Li), calcium (Ca) and a mixture thereof.

For example, the anode electrode 1121 may be made up of a multilayer structure of ITO/Mg, ITO/MgF, ITO/Ag, and ITO/Ag/ITO.

The pixel-defining layer 1122 is disposed in a non-emission area NEA which is the boundary between the emission areas EA of the display area DA. The pixel-defining layer 1122 may cover the edges of the anode electrode 1121 of each of the emission areas EA.

For example, the pixel-defining layer 1122 may be penetrated by an opening exposing the anode electrode 1121 of each of the emission areas EA.

The emission areas EA and the non-emission area NEA may be distinguished by the pixel-defining layer 1122.

The pixel-defining layer 1122 may be made of an insulating material. For example, the pixel-defining layer 1122 may be made of at least one organic insulating material selected from the group consisting of: polyacrylate resin, epoxy resin, phenolic resin, polyamide resin, polyimide resin, unsaturated polyester resin, polyphenylene ether resin, polyphenylene sulfide resin, and benzocyclobutene (BCB). Alternatively, the pixel-defining layer 1122 may be made of an inorganic insulating material.

The emissive layer 1123 may be disposed on the anode electrode 1121 of each of the emission areas EA exposed through the opening penetrating through the pixel-defining layer 1122.

The emissive layer 1123 may include or may be formed of an organic luminescent material.

For example, the emissive layer 1123 may include or may be formed of an organic emissive layer (not shown), a hole transport layer (not shown) between the organic emissive layer and the anode electrode 1121, and an electron transport layer between the organic emissive layer and the cathode 1124. In addition, the emissive layer 1123 may further include a hole injection layer disposed between the hole transport layer and the anode electrode 1121, or an electron injection layer disposed between the electron transport layer and the cathode electrode 1124.

Alternatively, the emissive layer 1123 may have a tandem structure including a plurality of stacks each including an organic emissive layer and a charge generation layer disposed between the plurality of stacks. The plurality of stacks may include an organic emissive layer emitting light of the same wavelength range. Alternatively, the plurality of stacks may include organic emissive layers emitting light of different wavelength ranges.

Incidentally, when the display device 10 is a micro LED display device or a nano LED display device, the emissive layer 1123 may include or may be formed of an inorganic semiconductor.

The cathode electrode 1124 may be a common electrode commonly extended across the emission areas EA.

The cathode electrode 1124 may include or may be formed of a material layer having a small work function such as Li, Ca, LiF/Ca, LiF/Al, Al, Mg, Ag, Pt, Pd, Ni, Au, Nd, Jr, Cr, BaF and Ba, or a compound or mixture thereof (e.g., a mixture of Ag and Mg).

Alternatively, the cathode electrode 1124 may further include a transparent metal oxide layer disposed on the material layer with a small work function.

The encapsulation layer 113 may have a structure in which inorganic layers 1131 and 1133 each made of an inorganic insulating material and at least one organic layer 1132 made of an organic insulating material are alternately stacked on one another. The both surfaces of the organic layer 1132 may be in contact with the inorganic layers.

Specifically, the encapsulation layer 113 may include the first inorganic layer 1131 disposed on the light-emitting element layer 112 to directly cover the light-emitting element layer 112 and made of an inorganic insulating material; the organic layer 1132 disposed on the first inorganic layer 1131 to overlap the light-emitting element layer 112 and made of an organic insulating material; and the second inorganic layer 1133 disposed on the first inorganic layer 1131 to cover the organic layer 1132 and made of an inorganic insulating material.

Each of the first inorganic layer 1131 and the second inorganic layer 1133 may be made of one of silicon nitride, silicon oxide, and silicon oxynitride. In an embodiment, the first inorganic layer 1131 may be the same as the second inorganic layer 1133 in kind. For example, each of the first and second inorganic layers 1131 and 1133 may be formed of silicon nitride. The present disclosure is not limited thereto. In an embodiment, the first inorganic layer 1131 may be different from the second inorganic layer 1133 in kind. For example, the first inorganic layer 1131 may be formed of silicon nitride, and the second inorganic layer 1133 may be formed of silicon oxide.

In the non-display area NDA, the first inorganic layer 1131 is in contact with an inorganic insulating material layer (not shown) of the circuit layer 114 and the second inorganic layer 1133. For example, an encapsulation structure including bonding of inorganic materials may be prepared. By virtue of the encapsulation layer 113, the light-emitting element layer 112 can be protected from oxygen or moisture.

The organic layer 1132 may be made of one of: polyacrylate resin, epoxy resin, phenolic resin, polyamide resin, polyimide resin, unsaturated polyesters resin, polyphenylene ether resin, polyphenylene sulfide resin, and benzocyclobutene (BCB).

By virtue of the organic layer 1132, the light-emitting element layer 112 can be protected from a physical impact caused by foreign matters or the like.

As shown in FIG. 5, according to the embodiment, the first inorganic layer 1131 covering the light-emitting element layer 112 may have a smaller thickness than that of the second inorganic layer 1133 on the first inorganic layer 1131. For example, the first inorganic layer 1131 that contacts the light-emitting element layer 112 may have a smaller thickness than a thickness of the second inorganic layer 1133. In this manner, it is possible to prevent foreign matters (not shown) on the light-emitting element layer 112 from being more strongly fixed on the light-emitting element layer 112 by the adhesive force of the first inorganic layer 1131, so that the foreign matters (not shown) can be relatively easily removed.

For example, in terms of the encapsulation function and the function of blocking oxygen and/or moisture by the encapsulation layer 113, the thickness TH3 of the second inorganic layer 1133 may be in the range of approximately 0.7 μm to approximately 1.2 μm.

In this instance, the thickness TH1 of the first inorganic layer 1131 may be equal to or less than approximately 0.3 μm in order to prevent the first inorganic layer 1131 from being used as an adhesive for more strongly fixing foreign matters. For example, the maximum thickness that the first inorganic layer 1131 may have is a critical thickness at which or below which the first inorganic layer 1131 may lose the property of an adhesive.

In addition, the thickness TH1 of the first inorganic layer 1131 may be equal to or greater than approximately 0.05 μm in order to maintain the function of blocking oxygen and/or moisture by the first inorganic layer 1131. In some embodiments, the first inorganic layer 1131 may have a thickness selected from a range of approximately 0.05 µm to approximately 0.3 µm.

In addition, the thickness TH2 of the organic layer 1132 may be in the range of approximately 2.0 µm to approximately 4.0 µm in order to prevent the first inorganic layer 1131 from being vulnerable to physical impact because it has a relatively small thickness.

In addition, the thickness TH4 of the filling layer 130 may be in the range of approximately 4 µm to approximately 5 µm in order to prevent the first inorganic layer 1131 from being vulnerable to a physical impact because it has a relatively small thickness.

The first inorganic layer 1131 may include a first sub-layer SBL1 disposed on the light-emitting element layer 112, an assisting layer ASL disposed on the first sub-layer SBL1, and a second sub-layer SBL2 disposed on the assisting layer ASL.

The first sub-layer SBL1 and the second sub-layer SBL2 may be formed of the same inorganic insulating material. In this manner, it is possible to prevent reduction in light efficiency due to a difference in refractive index between the first sub-layer SBL1 and the second sub-layer SBL2.

The assisting layer ASL may be made of an inorganic insulating material which contains a greater content of hydrogen (H) than the inorganic insulating material of the first sub-layer SBL1 and the inorganic insulating material of the second sub-layer SBL2.

Since the assisting layer ASL contains a relatively large amount of hydrogen (H), it may have stronger hydrophobicity than the inorganic insulating material of the first sub-layer SBL1 and the inorganic insulating material of the second sub-layer SBL2.

As an example, the assisting layer ASL may be prepared by hydrogen (H 2) plasma treatment on the surface of the first sub-layer SBL1.

As described above, according to the embodiment, the first inorganic layer 1131 covering the light-emitting element layer 112 may have a smaller thickness TH1 (in the range of approximately 0.05 µm to approximately 0.3 µm) which is smaller than the thickness TH3 (in the range of approximately 0.7 µm to approximately 1.2 µm) of the other inorganic layer 1133. For example, the first inorganic layer 1131 that contacts the light-emitting element layer 112 may have a first thickness TH1 (in the range of approximately 0.05 µm to approximately 0.3 µm) which is smaller than the thickness TH3 (in the range of approximately 0.7 µm to approximately 1.2 µm) of the second inorganic layer 1133.

In this manner, it is possible to prevent foreign matters above or on the light-emitting element layer 112 from being more strongly fixed on the light-emitting element layer 112, so that the foreign matters can be relatively easily removed.

In addition, according to the embodiment, instead of reducing the thickness TH1 of the first inorganic layer 1131, the thickness TH2 of the organic layer 1132 and/or the thickness TH4 of the filling layer 130 may be increased. By doing so, it is possible to avoid that the protection function and the encapsulation function of the encapsulation layer 113 becomes weaker even though the first inorganic layer 1131 has a relatively small thickness TH1.

In addition, according to an embodiment of the present disclosure, the first inorganic layer 1131 has a stacked structure of the first sub-layer SBL1, the assisting layer ASL and the second sub-layer SBL2, and may be made of an inorganic insulating material with stronger hydrophobicity. Accordingly, it is possible to avoid weakening of the encapsulation function and the function of blocking moisture by the first inorganic layer 1131 despite the relatively small thickness TH1 of the first inorganic layer 1131.

As shown in FIG. 4, the second substrate 120 may include an encapsulation substrate 121 facing the support substrate 111 and including a display area DA, a color filter layer 122 disposed on one surface of the encapsulation substrate 121, a first capping layer 124 covering the color filter layer 112, a color conversion layer 125 disposed on the first capping layer 124, a second capping layer 126 covering the color conversion layer 125, and a low-refractive layer 123 disposed between the color filter layer 122 and the color conversion layer 125 and made of a material having a lower refractive index than that of the color conversion layer 125.

Like the support substrate 111, the encapsulation substrate 121 may be made of a transparent and rigid insulating material. For example, the encapsulation substrate 121 may be made of glass, quartz, etc.

Alternatively, the encapsulation substrate 121 may be made of a transparent and flexible insulating material. For example, the encapsulation substrate 121 may be made of a plastic material having flexibility so that it can be bent, folded, or rolled, such as polyimide.

The encapsulation substrate 121 may be made of the same material as the support substrate 111. Alternatively, the encapsulation substrate 121 may have different material, thickness and transmittance from those of the support substrate 111.

The color filter layer 112 may include a light-blocking portion BLP disposed in the non-emission area NEA surrounding each of the emission areas EA; a first color filter portion CFP1 disposed in the first emission area EA1 and transmitting light of a first color; a second color filter portion CFP2 disposed in the second emission area EA2 and transmitting light of a second color; and a third color filter portion CFP3 disposed in the third emission area EA3 and transmitting light of a third color.

The light-blocking portion BLP may be disposed not only in the non-emission area NEA but also in the non-display area NDA. Light leakage in the non-emission area NEA other than the emission areas EA on the display surface of the display panel 100 and the non-display area NDA can be blocked by the light-blocking portion BLP.

For example, as shown in FIG. 4, the light-blocking portion BLP may be implemented by stacking at least two of the first color filter portion CFP1, the second color filter portion CFP2 and the third color filter portion CFP3.

Alternatively, the light-blocking portion BLP may be made of a light-absorbing material that absorbs light, such as a black matrix.

The first color filter portion CFP1, the second color filter portion CFP2 and the third color filter portion CFP3 are for increasing the color purity of the first color, the second color and the third color output from the emission areas EA, respectively.

Each of the first color filter portion CFP1, the second color filter portion CFP2 and the third color filter portion CFP3 may include or may be formed of a colorant such as a dye and a pigment.

For example, the first color filter portion CFP1 may include or may be formed of a colorant that absorbs light in a wavelength range other than the wavelength range corresponding to the first color among visible light, and may transmit light in the wavelength range corresponding to the first color.

The second color filter portion CFP2 may include or may be formed of a colorant that absorbs light in a wavelength range other than the wavelength range corresponding to the second color among visible light, and may transmit light in the wavelength range corresponding to the second color.

The third color filter portion CFP3 may include or may be formed of a colorant that absorbs light in a wavelength range other than the wavelength range corresponding to the third color among visible light, and may transmit light in the wavelength range corresponding to the third color.

The low-refractive layer 123 may be disposed between the color filter layer 122 and the color conversion layer 125, and may be made of a material having a lower refractive index than the color conversion layer 125.

For example, the low-refractive layer 123 may be made of an organic material having a refractive index of approximately 1.1 to 1.4. Due to the low-refractive layer 123, loss of light from the color conversion layer 125 to the color filter layer 122 can be reduced.

In addition, the low-refractive layer 123 may include particles dispersed in an organic material. With this configuration, some of the lights output from the color conversion layer 125 toward the encapsulation substrate 121 may be returned to the color conversion layer 125 by the low-refractive layer 123. For example, since some of the lights output from the color conversion layer 125 toward the encapsulation substrate 121 may be recycled by the low-refractive layer 123, so that light efficiency can be improved.

The low-refractive layer 123 may be disposed between the color filter layer 122 and the first capping layer 124. In this way, the low-refractive layer 123 may be protected by the first capping layer 124.

Alternatively, the low-refractive layer 123 may be disposed between the first capping layer 124 and the color conversion layer 125. In this way, it is possible to prevent the colorant of the color filter layer 122 from diffusing into the low-refractive layer 123.

The first capping layer 124 may be made of an inorganic material. For example, the first capping layer 124 may include or may be formed of at least one of: silicon nitride, aluminum nitride, zirconium nitride, titanium nitride, hafnium nitride, tantalum nitride, silicon oxide, aluminum oxide, titanium oxide, tin oxide, and silicon oxynitride.

Due to the first capping layer 124, the color filter layer 122 can be protected from impurities such as moisture and air permeating from the outside, and thus it is possible to reduce damage or contamination of the color filter layer 122.

In addition, it is possible to prevent diffusion of the colorant of the color filter layer 122 to other layers by the first capping layer 124.

The color conversion layer 125 may include a bank portion BKP disposed in the non-emission area NEA surrounding each of the emission areas EA; a first color conversion portion CCP1 disposed in the first emission area EA1 and converting the light of the third color emitted from the light-emitting elements LE in the first emission area EA1 into light of the first color; a second color conversion portion CCP2 disposed in the second emission area EA2 and converting the light of the third color emitted from the light-emitting elements LE in the second emission area EA2 into light of the second color; and a transparent portion TP disposed in the third emission area EA3 and transmitting the light of the third color emitted from the light-emitting elements LE in the third light-emitting area EA3.

The bank portion BKP may be made of a light-blocking material that blocks light in the visible wavelength range. For example, the bank portion BKP may include or may be formed of an organic light-blocking material.

By virtue of the bank portion BKP, light can be output only from each of the emission areas EA. Therefore, it is possible to prevent color mixing between the adjacent emission areas EA.

The first color conversion portion CCP1 may overlap with the first color filter portion CFP1 and may include a first base resin BRS1 and first wavelength conversion particles (bandwidth changing particles) BCP1 dispersed in the first base resin BRS1. The first wavelength conversion particles BCP1 may be made of a material that converts light of the third color into light of the first color.

The first color conversion portion CCP1 converts the light of the third color into the wavelength range corresponding to the first color.

The second color conversion portion CCP2 may overlap with the second color filter portion CFP2 and may include a second base resin BRS2 and second wavelength conversion particles BCP2 dispersed in the second base resin BRS2. The second wavelength conversion particles BCP2 may be made of a material that converts light of the third color into light of the second color.

The second color conversion portion CCP2 converts the light of the third color into the wavelength range corresponding to the second color.

The transparent portion TP may overlap with the first color filter pattern portion CFP3 and may include a third base resin BRS3 and scattering particles SCP dispersed in the third base resin BRS3.

The scattering particles SCP may be formed as metal oxide particles or organic particles.

Examples of the metal oxide particles may include titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$).

Examples of the organic particles may include an acrylic resin, a urethane-based resin, or the like.

The transparent portion TP transmits and/or scatters light of the third color.

Each of the first, second and third base resins BRS1, BRS2 and BRS3 may be formed of a transparent organic material. Examples of the transparent organic material may include an epoxy-based resin, an acrylic-based resin, a cardo-based resin, or an imide-based resin.

The first, second and third base resins BRS1, BRS2 and BRS3 may be made of the same material, but the present disclosure is not limited thereto.

Each of the first wavelength conversion particles BCP1 and the second wavelength conversion particles BCP2 may be at least one of a quantum dot, a quantum bar, and a phosphor.

The quantum dots may be one selected from group IV nanocrystals, group II-VI compound nanocrystals, group III-V compound nanocrystals, group IV-VI nanocrystals, or combinations thereof.

The first and second color conversion portions CCP1 and CCP2 may further include scattering particles SCP, like the transparent portion TP.

The second capping layer 126 may be made of an inorganic material. For example, the second capping layer 126 may include or may be formed of at least one of: silicon nitride, aluminum nitride, zirconium nitride, titanium nitride, hafnium nitride, tantalum nitride, silicon oxide, aluminum oxide, titanium oxide, tin oxide, and silicon oxynitride.

The filling layer 130 is disposed in the display area DA and is used to fill the space between the first substrate 110 and the second substrate 120. The filling layer 130 can mitigate stress applied to the first substrate 110 and/or the second substrate 120 due to an external physical impact.

The filling layer 130 may be made of a transparent filling material. In addition, since the filling layer 130 includes a material having adhesiveness, the first substrate 110 and the second substrate 120 can be further reliably attached together.

The filling layer 130 may include or may be formed of an organic material. For example, the filling layer 130 may be made of a silicon (Si)-based organic material, an epoxy-based organic material, etc.

Next, the circuit layer 114 of the display device 10 according to an embodiment will be described with reference to FIGS. 6, 7 and 8.

Figure 6:
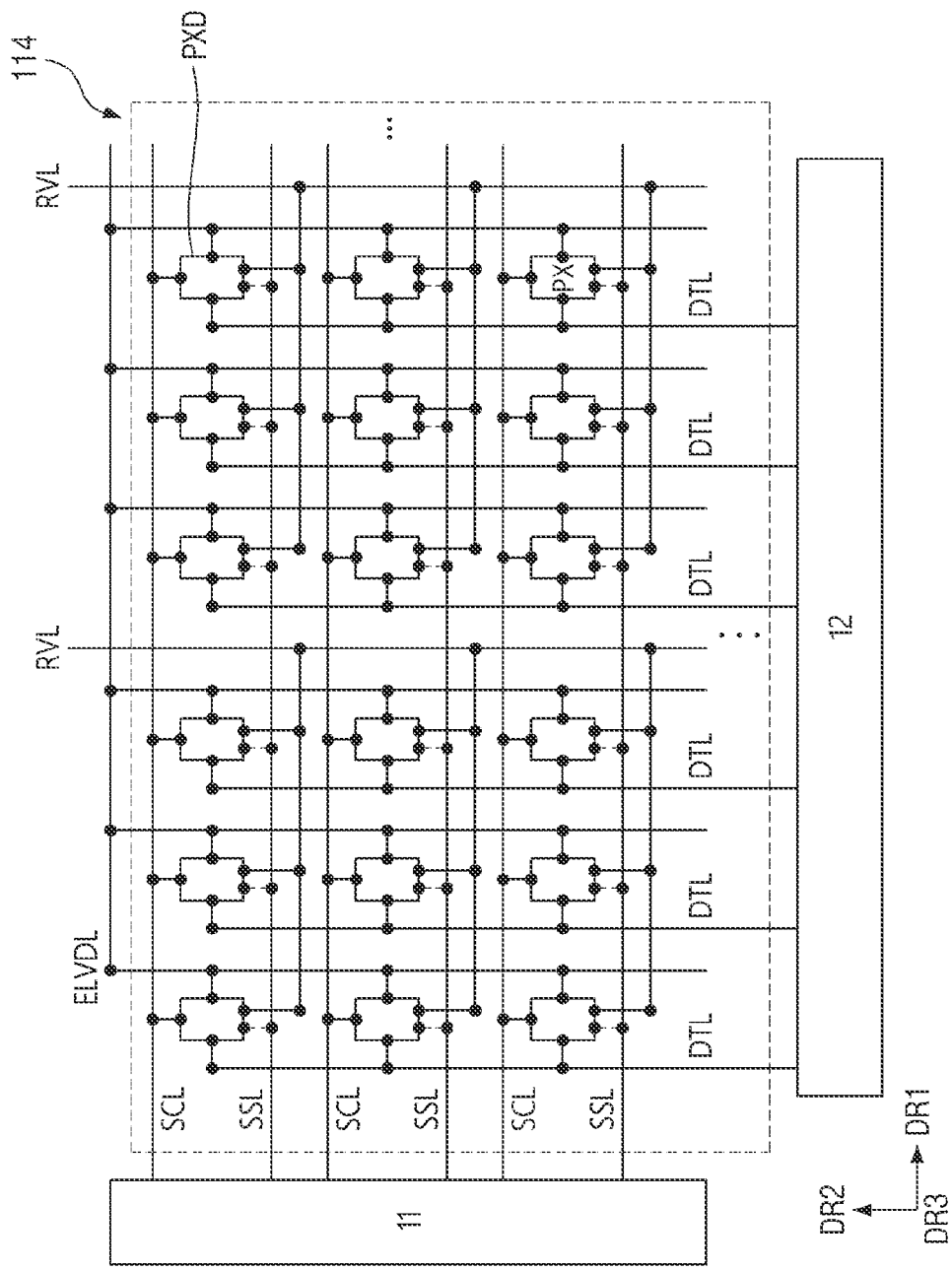
FIG. 6 is a view showing a layout of lines in the display device of FIG. 1.

FIG. 6 is a view showing a layout of lines in the display device of FIG. 1. FIG. 7 is an equivalent circuit diagram of the pixel driver of FIG. 6. FIG. 8 is a cross-sectional view showing an example of the driving transistor and the light-emitting element of FIG. 7.

Referring to FIG. 6, the circuit layer 114 of the display panel 100 of the display device 10 according to the embodiment may include pixel drivers PXD associated with sub-pixels SP (see FIG. 3), respectively, and lines SSL, SCL, DTL, RVL and ELVDL that transmit signals or voltages to the pixel drivers PXD.

The lines SSL, SCL, DTL, RVL and ELVDL of the circuit layer 114 may include scan lines SCL and sensing signal lines SSL extended in the first direction DR1, and data lines DTL and reference voltage lines RVL extended in the second direction DR2.

The scan lines SCL and the sensing signal lines SSL extended in the first direction DR1 among the lines SSL, SCL, DTL and RVL of the circuit layer 114 may electrically connect between the scan driver 11 and the pixel drivers PXD.

The scan driver 11 may transmit scan signals for selecting the sub-pixels SP to the pixel drivers PXD through the scan lines SCL in order to perform writing operation of data signals.

The scan driver 11 may transmit sensing signals for selecting the sub-pixels SP to the pixel drivers PXD through the sensing signal lines SSL in order to perform sensing operation.

The scan driver 11 may be implemented as a part of the circuit layer 114.

The data lines DTL extended in the second direction DR2 among the lines SSL, SCL, DTL and RVL of the circuit layer 114 electrically connect the data driver 12 with the pixel drivers PXD.

The data driver 12 may transmit data signals corresponding to the luminances of the sub-pixels SP to the pixel drivers PXD through the data lines DTL for displaying images.

The data driver 12 may be implemented as an integrated circuit chip mounted on the display panel 100 or a circuit board 13 (see FIG. 1) bound to the display panel 100.

In addition, the lines SSL, SCL, DTL, RVL and ELVDL of the circuit layer 114 may further include a first supply voltage line ELVDL that transmits first voltage for driving the light-emitting elements LE.

Figure 7:
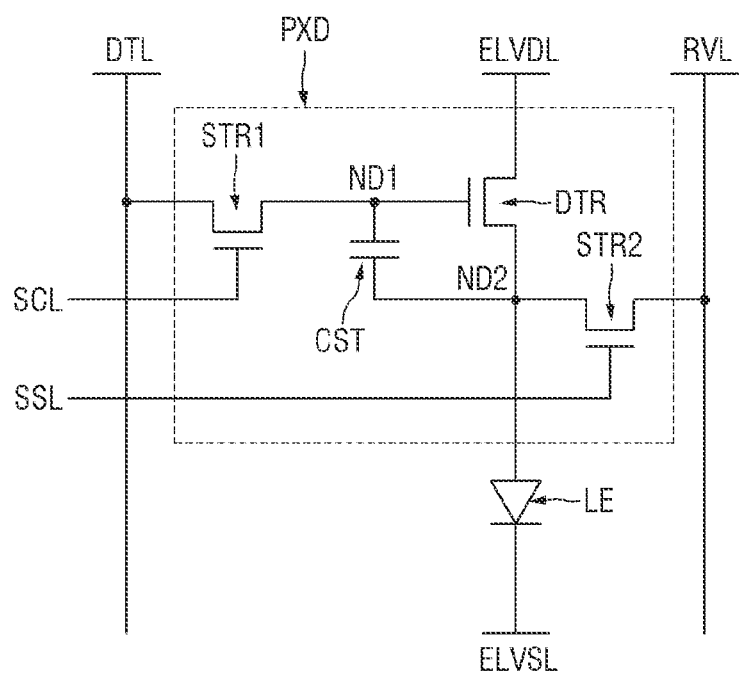
FIG. 7 is an equivalent circuit diagram of the pixel driver of FIG. 6.

Referring to FIG. 7, one of the pixel drivers PXD associated with the sub-pixels SP, respectively, may include a driving transistor DTR, a first switching transistor STR1, a second switching transistor STR2, and a storage capacitor CST.

The driving transistor DTR may be electrically connected between a first supply voltage line ELVDL and a light-emitting element LE.

The light-emitting element LE may be electrically connected between the driving transistor DTR and a second supply voltage line ELVSL. The second supply voltage line ELVSL may transmit a second voltage having a voltage level different from that of the first voltage.

For example, the driving transistor DTR and the light-emitting element LE may be connected in series between the first supply voltage line ELVDL and the second supply voltage line ELVSL.

For example, a first electrode (e.g., a source electrode) of the driving transistor DTR may be electrically connected to a first electrode (e.g., an anode electrode) of the light-emitting element LE.

A second electrode (e.g., a drain electrode) of the driving transistor DTR may be electrically connected to the first supply voltage line ELVDL.

A second electrode (e.g., a cathode electrode) of the light-emitting element LE may be electrically connected to the second supply voltage line ELVSL.

The first switching transistor STR1 may be electrically connected between a data line DTL and a gate electrode of the driving transistor DTR.

For example, a first electrode (e.g., a source electrode) of the first switching transistor STR1 may be electrically connected to the gate electrode of the driving transistor DTR.

A second electrode (e.g., a drain electrode) of the first switching transistor STR1 may be electrically connected to the data line DTL.

A gate electrode of the first switching transistor STR1 may be electrically connected to a scan line SCL.

Accordingly, the first switching transistor STR1 may be turned on based on the scan signal transmitted through the scan line SCL, and the data signal of the data line DTL may be supplied to the gate electrode of the driving transistor DTR through the turned-on first switching transistor STR1.

At this time, since the potential of the gate electrode of the driving transistor DTR corresponds to the data signal, the driving transistor DTR may generate a driving current proportional to the voltage difference between the gate electrode and the source electrode. Accordingly, the driving current corresponding to the data signal may be transmitted to the light-emitting element LE by the turned-on driving transistor DTR, so that the light-emitting element LE may emit light having the luminance corresponding to the data signal.

The storage capacitor CST may be electrically connected between a first node ND1 and a second node ND2. The first node ND1 is a contact point between the first switching transistor STR1 and the gate electrode of the driving transistor DTR. The second node ND2 is a contact point between the driving transistor DTR and the light-emitting element LE.

A voltage difference between the gate electrode and the source electrode of the driving transistor DTR may be maintained for a predetermined period by the storage capacitor CST.

The second switching transistor STR2 may be electrically connected between the second node ND2 and a reference voltage line RVL.

A gate electrode of the second switching transistor STR2 may be electrically connected to a sensing signal line SSL.

Accordingly, the second switching transistor STR2 may be turned on based on a sensing signal transmitted through the sensing signal line SSL, and the voltage at the second node ND2 may be initialized to a reference voltage of the reference voltage line RVL through the turned-on second switching transistor STR2.

Alternatively, the voltage at the second node ND2 may be collected through the turned-on second switching transistor STR2 and the reference voltage line RVL.

In the example shown in FIG. 7, the transistors DTR, STR1 and STR2 of the pixel driver PXD are n-type MOSFETs. It should be understood, however, that the present disclosure is not limited thereto. The pixel driver PXD according to the embodiment is not limited to that shown in FIG. 7. For example, at least one of the transistors DTR, STR1 and STR2 of the pixel driver PXD according to the embodiment may be implemented as a p-type MOSFET.

Figure 8:
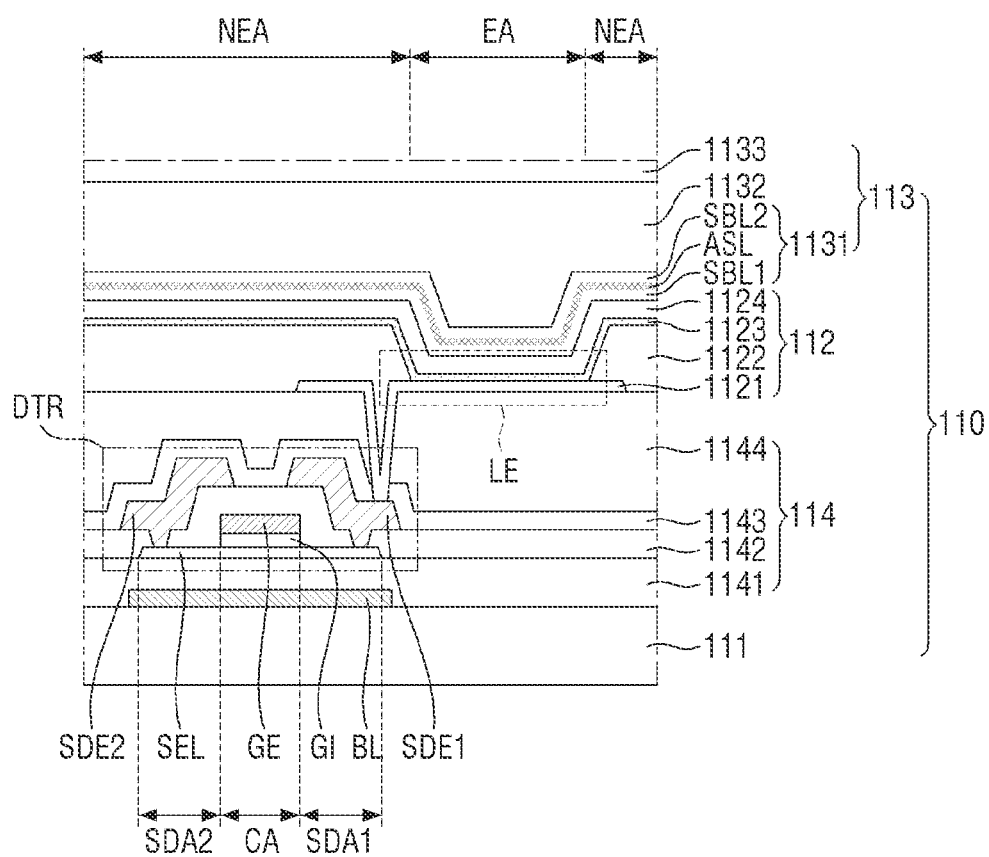
FIG. 8 is a cross-sectional view showing an example of the driving transistor and the light-emitting element of FIG. 7.

Referring to FIG. 8, the circuit layer 114 may include a barrier layer BL on a support substrate 111, a semiconductor layer SEL on a buffer layer 1141 covering the barrier layer BL, a gate conductive layer GE on a gate insulator GI covering a channel region CA of the semiconductor layer SEL, source-drain conductive layers SDE1 and SDE2 on an interlayer dielectric layer 1142 covering the semiconductor layer SEL and the gate conductive layer GE, an auxiliary insulating layer 1143 covering the source-drain conductive layers SDE1 and SDE2, and a planarization layer 1144 disposed on the auxiliary insulating layer 1143.

In this instance, the driving transistor DTR may include the semiconductor layer SEL, the gate electrode GE formed of the gate conductive layer, and a first electrode SDE1 and a second electrode SDE2 formed of the source-drain conductive layers.

In addition, although not shown in the drawings, each of the first switching transistor STR1 and the second switching transistor STR2 of FIG. 7 may have the same structure as that of the driving transistor DTR. It should be understood, however, that embodiments of the present disclosure are not limited thereto. For example, at least one of the first switching transistor STR1 and the second switching transistor STR2 may have a different structure from that of the driving transistor DTR.

The barrier layer BL may be disposed on one surface of the support substrate 111 and overlap with the semiconductor layer SEL. Alternatively, the barrier layer BL may overlap with at least the channel region CA of the semiconductor layers SEL.

The barrier layer BL may be formed of a light-blocking material or a light-absorbing material.

By virtue of the barrier layer BL, the semiconductor layer SEL can be protected from light passing through the support substrate 111. Accordingly, it is possible to prevent the threshold voltage characteristic of the semiconductor layer SEL from being changed by the light passing through the support substrate 111.

The buffer layer 1141 is disposed on one surface of the support substrate 111 and covers the barrier layer BL.

The buffer layer 1141 may be made up of a single layer or multiple layers of at least one of silicon nitride, silicon oxide, and silicon oxynitride.

The buffer layer 111 can prevent permeation of oxygen or moisture through the support substrate 111.

The semiconductor layer SEL may be disposed on the buffer layer 1141.

The semiconductor layer SEL may include a channel region CA overlapping the gate electrode GE, a source region SDA1 in contact with one side of the channel region CA, and a drain region SDA2 in contact with the other side of the channel region CA.

The semiconductor layer SEL may be formed of one of a silicon semiconductor and an oxide semiconductor.

The oxide semiconductor may include or may be formed of at least one of: a binary compound (ABx), a ternary compound (ABxCy) and a quaternary compound (ABxCyDz) which contains indium, zinc, gallium, tin, titanium, aluminum, hafnium (Hf), zirconium (Zr), and magnesium (Mg).

For example, when the semiconductor layer SEL is made of an oxide semiconductor, the source region SDA1 and the drain region SDA2 of the semiconductor layer SEL may be in a conductive state.

The gate insulator GI serves to insulate between the semiconductor layer SEL and the gate electrode GE, and may be disposed on the channel region CA of the semiconductor layer SEL.

The gate insulator GI may include or may be formed of a silicon compound or a metal oxide. For example, the gate insulator GI may include or may be formed of silicon oxide, silicon nitride, silicon oxynitride, aluminum oxide, tantalum oxide, hafnium oxide, zirconium oxide, or titanium oxide.

The gate electrode GE may be disposed on the gate insulator GI and overlap the channel region CA of the semiconductor layer SEL.

Although not shown in the drawings, the gate conductive layer including the gate electrode GE may have a multi-layer structure including a first metal layer on the gate insulator GI and a second metal layer on the first metal layer.

The second metal layer may be made of a metal material having a relatively low resistance.

The first metal layer may be made of a material that has relatively high adhesion to the gate insulator GI and can block diffusion of the material of the second metal layer into the semiconductor layer SEL.

For example, the first metal layer may be made of titanium (Ti), and the second metal layer may be made of copper (Cu).

The interlayer dielectric layer 1142 is disposed entirely on the buffer layer 1141 and covers the semiconductor layer SEL and the gate conductive layer GE.

The interlayer dielectric layer 1142 may be made of an inorganic insulating material such as silicon oxide, silicon nitride, silicon oxynitride, hafnium oxide, aluminum oxide, titanium oxide, tantalum oxide and zinc oxide.

The source-drain conductive layers on the interlayer dielectric layer 1142 may include a first electrode SDE1 and a second electrode SDE2.

The first electrode SDE1 may be electrically connected to the source region SDA1 of the semiconductor layer SEL through a hole penetrating the interlayer dielectric layer 1142.

The second electrode SDE2 may be electrically connected to the drain region SDA2 of the semiconductor layer SEL through a hole penetrating the interlayer dielectric layer 1142.

The auxiliary insulating layer 1143 is disposed entirely on the interlayer dielectric layer 1142 and covers the source-drain conductive layers SDE1 and SDE2.

The auxiliary insulating layer 1143 may be made of an inorganic insulating material such as silicon oxide, silicon nitride, silicon oxynitride, hafnium oxide, aluminum oxide, titanium oxide, tantalum oxide and zinc oxide.

The planarization layer 1144 is disposed entirely on the auxiliary insulating layer 1143, and has a relatively large thickness to flatly cover the auxiliary insulating layer 1143.

The planarization layer 1144 may include or may be formed of an organic insulating material such as polyacrylate resin, epoxy resin, phenolic resin, polyamide resin, polyimide resin, unsaturated polyesters resin, poly phenylene ether resin, poly phenylene sulfide resin, and benzocyclobutene (BCB).

Alternatively, the planarization layer 1144 may further include a photosensitive material.

The light-emitting element layer 112 may be disposed on the planarization layer 1144 of the circuit layer 114.

The light-emitting element layer 112 may include an anode electrode 1121 disposed in each of the emission areas EA; a pixel-defining layer 1122 disposed in the non-emission area NEA; an emissive layer 1123 disposed on the anode electrode 1121 and the pixel-defining layer 1122; and a cathode electrode 1124 disposed on the emissive layer 1123.

The anode electrode 1121 may be electrically connected to the first electrode SDE1 of the driving transistor DTR through a hole penetrating through the auxiliary insulating layer 1143 and the planarization layer 1144.

In addition, the encapsulation layer 113 is to protect the light-emitting element layer 112 and the circuit layer 114 from permeation of oxygen or moisture and/or external physical impact, and may have a structure in which the first inorganic layer 1131, the organic layer 1132 and the second inorganic layer 1133 are stacked on one another.

The first inorganic layer 1131 may include a first sub-layer SBL1, an assisting layer ASL, and a second sub-layer SBL2.

The light-emitting element layer 112 and the encapsulation layer 113 have been described above with reference to FIGS. 4 and 5; and, therefore, the redundant descriptions thereof will be omitted.

Figure 9:
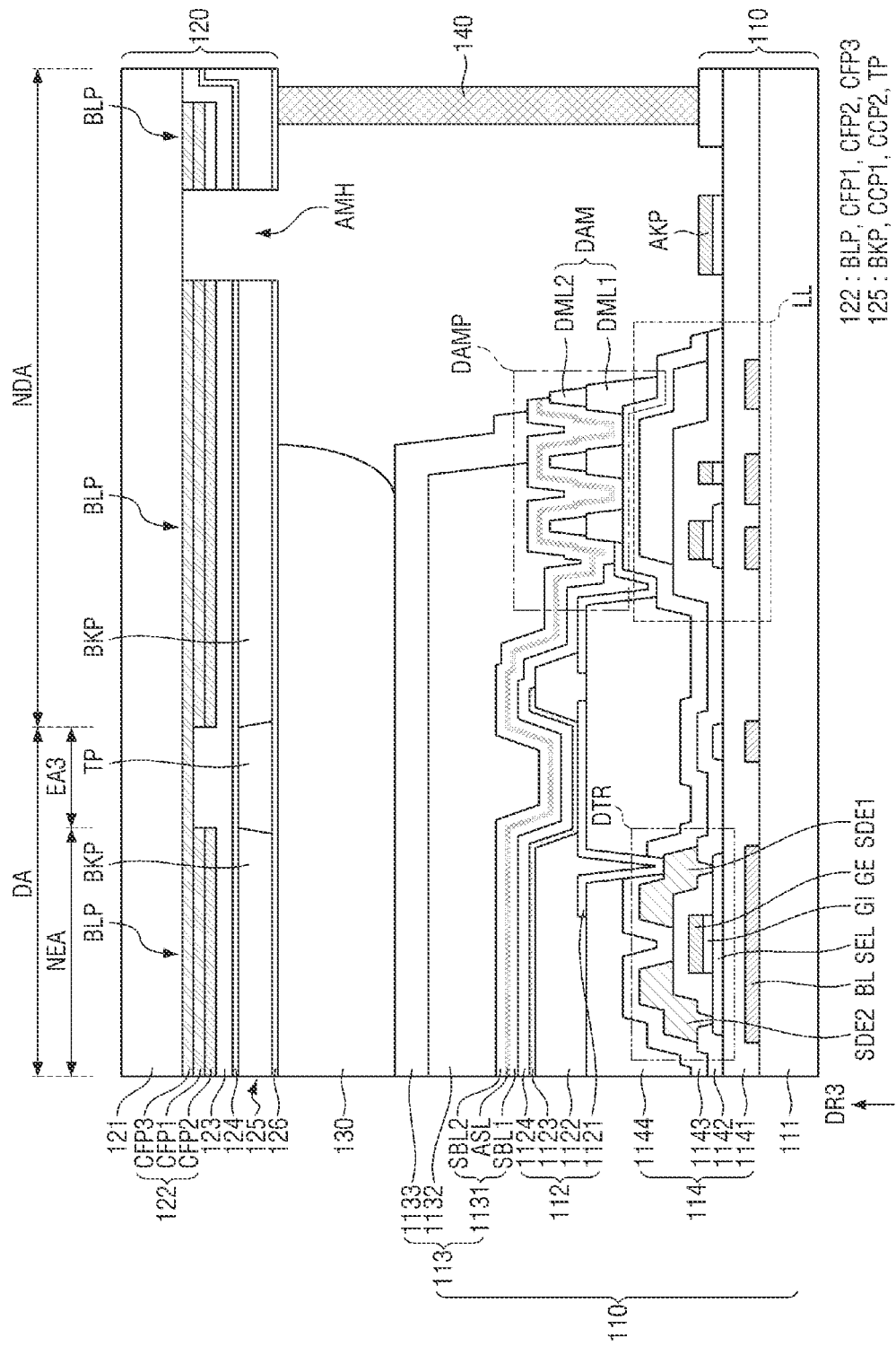
FIG. 9 is a cross-sectional view showing portion C of FIG. 2.

FIG. 9 is a cross-sectional view showing portion C of FIG. 2.

Referring to FIG. 9, according to an embodiment, the first substrate 110 of the display panel 100 of the display device 10 may further include a dam portion DAMP, a link line LL and an alignment key AKP disposed in the non-display area NDA, and the second substrate 120 may further include an alignment hole AMH.

The circuit layer 114 may further include the link line LL and signal pads (not shown) disposed in the non-display area NDA.

The signal pads may be terminals adjacent to the edge of the support substrate 111 and electrically connected to the circuit boards 13 (see FIG. 1).

The link line LL may electrically connect some of the lines SCL, SSL, DTL, RVL and ELVDL of the circuit layer 114 with the signal pads, respectively.

The link line LL may have a structure in which the barrier layer BL on the support substrate 111, the semiconductor layer SEL and the gate conductive layer GE on the buffer layer 1141, and at least one of the source-drain conductive layers SDE1 and SDE2 on the interlayer dielectric layer 1142 are connected with a bridge.

The dam portion DAMP may be used to limit the arrangement of the organic layer 1132 of the encapsulation layer 113. In other words, the organic layer 1132 of the encapsulation layer 113 may be disposed in a region surrounded by the dam portion DAMP.

Accordingly, the second inorganic layer 1133 covering the organic layer 1132 may be in direct contact with the first inorganic layer 1131 on the dam portion DAMP. In addition, in the valley between the dams DAM of the dam portion DAMP, the first inorganic layer 1131 may be in contact with the auxiliary insulating layer 1143 made of an inorganic insulating material. Accordingly, the encapsulation layer 113 may provide an encapsulation structure including bonding of inorganic materials.

The dam portion DAMP may include one or more dams DAM sequentially surrounding the edge of the display area DA.

One or more the dams DAM may include a first dam layer DML1 formed of the same layer as the planarization layer 1144 and a second dam layer DML2 formed of the same layer as the pixel-defining layer 1122.

The alignment key AKP is used to see whether the first substrate 110 and the second substrate 120 are properly aligned or not.

To this end, the alignment key AKP may be made of an opaque material.

For example, the alignment key AKP may have a structure in which the barrier layer BL, the gate conductive layer GE, and at least one of the source-drain conductive layers SDE1 and SDE2 of the circuit layer 114 overlap one another.

The alignment key AKP may be disposed in the form of an island spaced apart from other opaque materials in the vicinity so that it can be seen more clearly.

The light-blocking portion BLP of the color filter layer 122 of the second substrate 120 may be extended to the non-display area NDA.

In this manner, light leakage in the non-display area NDA can be reduced, and accordingly the display quality of the display area DA can be improved.

The alignment hole AMH may face the alignment key AKP of the first substrate 110, and may penetrate the light-blocking portion BLP of the color filter layer 122, the low-refractive layer 123, the first capping layer 124, the color conversion layer 125 and the second capping layer 126. Accordingly, a part of the encapsulation substrate 121 facing the alignment key AKP may be exposed by the alignment hole AMH.

The alignment hole AMH may have a width equal to or greater than the alignment key AKP.

It is possible to check whether the first substrate 110 and the second substrate 120 are properly aligned based on whether the alignment key AKP is normally seen through the alignment hole AMH on the opposite side of the encapsulation substrate 121.

As described above, according to the embodiment, the first inorganic layer 1131 in direct contact with the light-emitting element layer 112 has a smaller thickness TH1 than the second inorganic layer 1133 on the organic layer 1132.

In this manner, it is possible to prevent foreign matters (not shown) on the light-emitting element layer 112 from being more firmly fixed on the light-emitting element layer 112 by the first inorganic layer 1131, so that the foreign matters can be relatively easily removed.

In addition, according to the embodiment of the present disclosure, the first inorganic layer 1131 may include an assisting layer ASL that is disposed between the first sub-layer SBL1 and the second sub-layer SBL2 and contains a higher content of hydrogen (H) (i.e., a greater number of hydrogen atoms) than each of the first and second sub-layers SBL1 and SBL2. In an embodiment, the first and second sub-layers SBL1 and SBL2, and the assisting layer ASL disposed therebetween may be formed of the same inorganic insulating material in kind. In some embodiments, the assisting layer ASL may contain hydrogen atoms, and each of the first and second sub-layers SBL1 and SBL2 may be free of hydrogen atoms. In some embodiments, the assisting layer ASL may have more hydrogen atoms than each of the first and second sub-layers SBL1 and SBL2. The assisting layer ASL can supplement the function of blocking oxygen and/or moisture by the first inorganic layer 1131 which may be deteriorated due to the relatively small thickness TH1 of the first inorganic layer 1131.

In addition, according to an embodiment, the thickness TH2 of the organic layer 1132 may be in the range of approximately 2.0 μm to approximately 4.0 μm, or the thickness TH4 of the filling layer 130 may be in the range of approximately 4 μm to approximately 5 μm. Since the organic layer 1132 or the filling layer 130 has relatively large thickness as described above, even though the first inorganic layer 1131 has a relatively small thickness TH1, it is possible to avoid the function of mitigating physical impact by the encapsulation layer 113 from being deteriorated.

Hereinafter, a method of fabricating the display panel 100 of the display device 10 according to an embodiment of the present disclosure will be described with reference to FIGS. 10 to 30.

Figure 10:
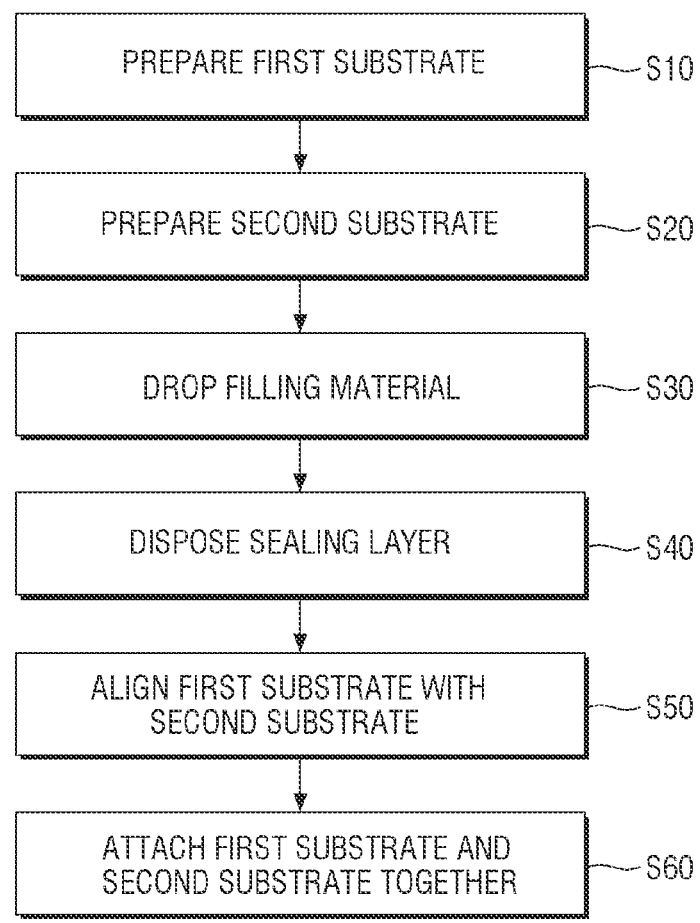
FIG. 10 is a flowchart illustrating a method of fabricating a display device according to an embodiment of the present disclosure.
Figure 11:
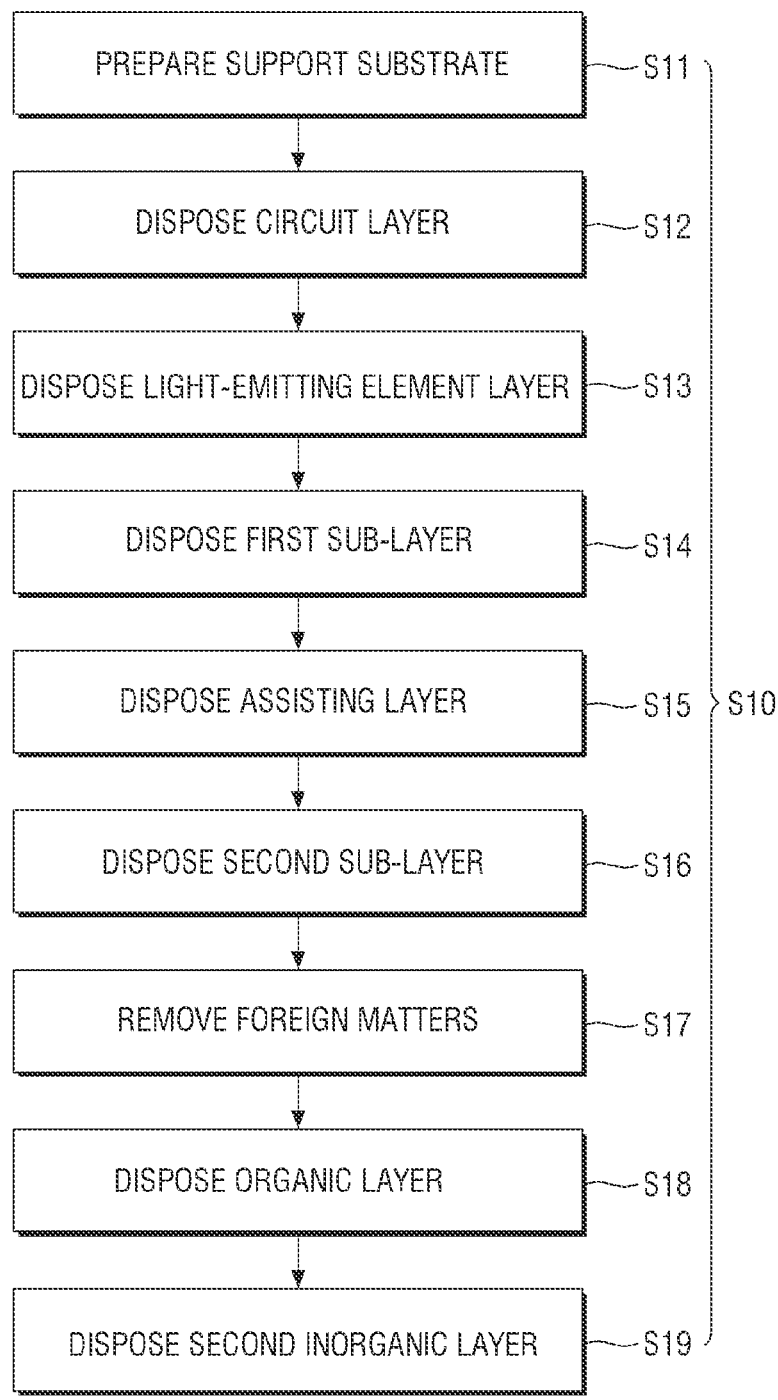
FIG. 11 is a flowchart illustrating steps of preparing the first substrate of FIG. 10.
Figure 12:
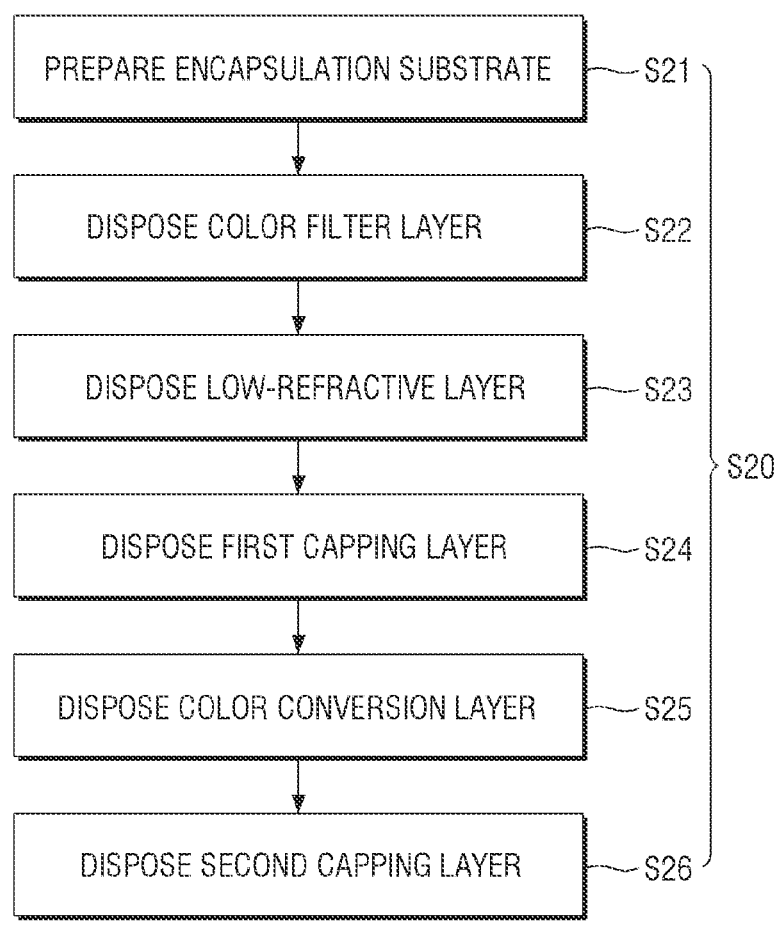
FIG. 12 is a flowchart illustrating steps of preparing the second substrate of FIG. 10.

FIG. 10 is a flowchart illustrating a method of fabricating a display device according to an embodiment of the present disclosure. FIG. 11 is a flowchart for illustrating steps of preparing the first substrate of FIG. 10. FIG. 12 is a flowchart for illustrating steps of preparing the second substrate of FIG. 10. FIGS. 13 to 30 are views showing some of the steps of FIGS. 10, 11 and 12.

Referring to FIG. 10, a method of fabricating the display device 10 according to an embodiment of the present disclosure includes preparing a first substrate 110 (step S10); preparing a second substrate 120 (step S20); disposing a sealing layer 140 on one of the first substrate 110 and the second substrate 120 (step S40); aligning the first substrate 110 and the second substrate 120 (step S50); and attaching the first substrate 110 and the second substrate 120 together using the sealing layer 140 (step S60).

In addition, the method of fabricating the display device 10 may further include dropping a filling material onto the second substrate 120 (step S30) prior to the step S40 of the disposing the sealing layer 140 S40.

Referring to FIG. 11, the step S10 of preparing the first substrate 100 includes: preparing a support substrate 111 including a display area DA in which emission areas EA associated with sub-pixels SP are arranged (step S11); disposing a circuit layer 120 including pixel drivers PXD associated with the sub-pixels SP, respectively, on one surface of the support substrate 111 (step S12); disposing the light-emitting element layer 112 including light-emitting elements LE associated with the emission areas EA, respectively, on the circuit layer 114 (step S13); disposing a first inorganic layer 1131 made of an inorganic insulating material on the light-emitting element layer 112 (steps S14, S15 and S16); disposing an organic layer 1132 overlapping the light-emitting element layer 112 and made of an organic insulating material on the first inorganic layer 1131 (step S18); and disposing a second inorganic layer 1133 covering the organic layer 1132 and made of an inorganic insulating material on the first inorganic layer 1131 (step S19).

By the step S19 of disposing the second inorganic layer 1133, the encapsulation layer 113 may be prepared, which has a structure in which the first inorganic layer 1131, the organic layer 1132 and the second inorganic layer 1133 are stacked.

In addition, the first substrate 110 including a support substrate 111, a circuit layer 114, a light-emitting element layer 112 and an encapsulation layer 113 may be prepared.

In the steps S14, S15 and S16 of disposing the first inorganic layer 1131, the thickness TH1 of the first inorganic layer 1131 is equal to or less than approximately 0.3 μm, which is relatively thin.

In addition, in the step S19 of disposing the second inorganic layer 1133, the thickness TH3 of the second inorganic layer 1133 may be range from approximately 0.7 μm to approximately 1.2 μm such that it is greater than the thickness TH1 of the first inorganic layer 1131.

The step S10 of preparing the first substrate 110 may further include removing foreign matters above the light-emitting element layer 112 prior to the step S18 of disposing the organic layer 1132.

The steps S14, S15 and S16 of disposing the first inorganic layer 1131 of the step S10 of preparing the first substrate 110 may include: disposing a first sub-layer SBL1 covering the light-emitting element layer 112 (step S14); disposing an assisting layer ASL by performing a hydrogen (H 2) plasma treatment on the surface of the first sub-layer SBL1 (step S15); and disposing a second sub-layer SBL2 on the assisting layer ASL (step S16). For example, the first sub-layer SBL1 may contact the light-emitting element layer 112.

In this manner, the first inorganic layer 1131 including the first sub-layer SBL1, the assisting layer ASL and the second sub-layer SBL2 may be disposed.

In the step S15 of disposing the assisting layer ASL, the assisting layer ASL is made of an inorganic insulating material subjected to hydrogen (H 2) plasma treatment, and thus may include a greater content of hydrogen (H) (i.e., a greater number of hydrogen atoms) than the inorganic insulating material of the first sub-layer SBL1 and the inorganic insulating material of the second sub-layer SBL2.

Referring to FIG. 12, the step S20 of preparing the second substrate 120 may include: preparing an encapsulation substrate 121 including the display area DA (step S21), disposing a color filter layer 122 on one surface of the encapsulation substrate 121 (step S22); disposing a first capping layer 124 covering the color filter layer 122 (step S24); disposing a color conversion layer 125 on the first capping layer 124 (step S25); and disposing a second capping layer 126 covering the color conversion layer 125 (step S26).

In addition, the step S20 of preparing the second substrate 120 may further include disposing a low-refractive layer 123 made of a material having a lower refractive index than the color conversion layer 125 (step S23) between the step S22 of disposing the color filter layer 122 and the step S25 of disposing the color conversion layer 125.

Figure 13:
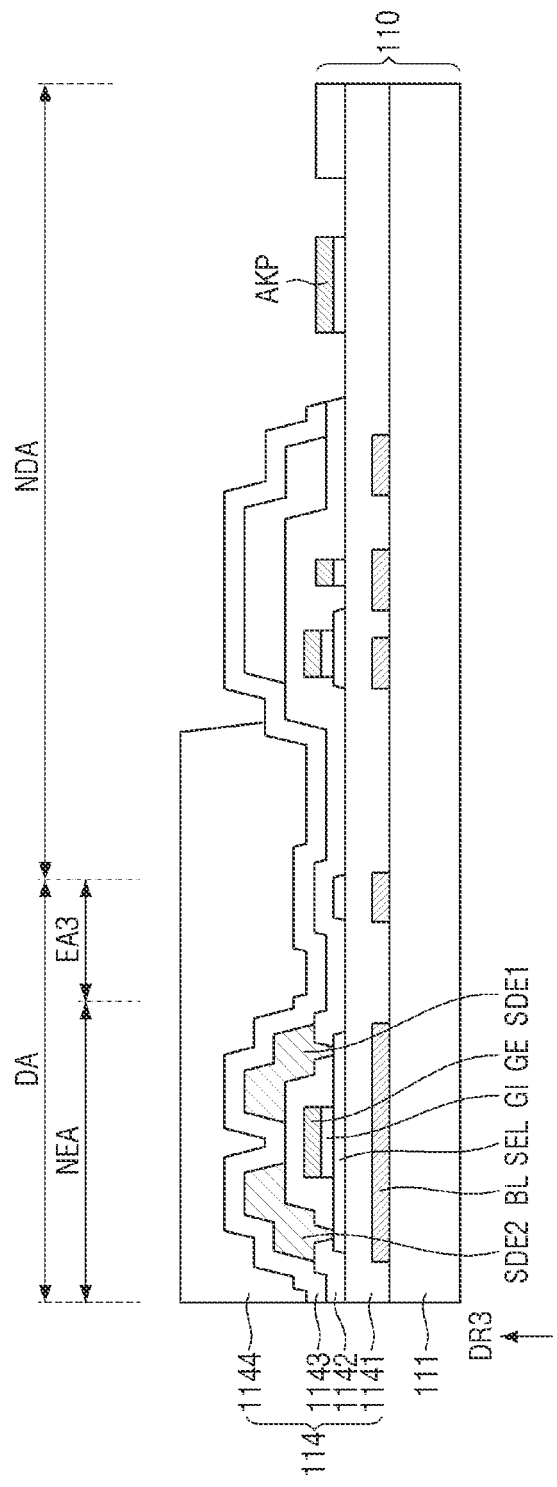
FIGS. 13 to 30 are views showing some of the steps of FIGS. 10, 11 and 12.

Referring to FIG. 13, a support substrate 111 including a display area DA and a non-display area NDA may be prepared (step S11).

Subsequently, a circuit layer 114 may be disposed on one surface of the support substrate 111 (step S12).

The circuit layer 114 may include a barrier layer BL disposed on one surface of a support substrate 111, a buffer layer 1141 covering the barrier layer BL, a driving transistor DTR disposed on the buffer layer 114, and a planarization layer 1144 flatly covering the driving transistor DTR and made of an organic insulating material.

The circuit layer 114 may further include an auxiliary insulating layer 1143 disposed between the driving transistor DTR and the planarization layer 1144 and made of an inorganic insulating material.

The driving transistor DTR may include a semiconductor layer SEL disposed on the buffer layer 1141, a gate insulator GI disposed on a channel region CA of the semiconductor layer SEL, a gate electrode GE disposed on the gate insulator GI, and a first electrode SDE1 and a second electrode SDE2 disposed on an interlayer dielectric layer 1142 covering the semiconductor layer SEL and the gate electrode GE.

The first electrode SDE1 may be electrically connected to a source region SDA1 of the semiconductor layer SEL.

The second electrode SDE2 may be electrically connected to a drain region SDA2 of the semiconductor layer SEL.

Figure 15:
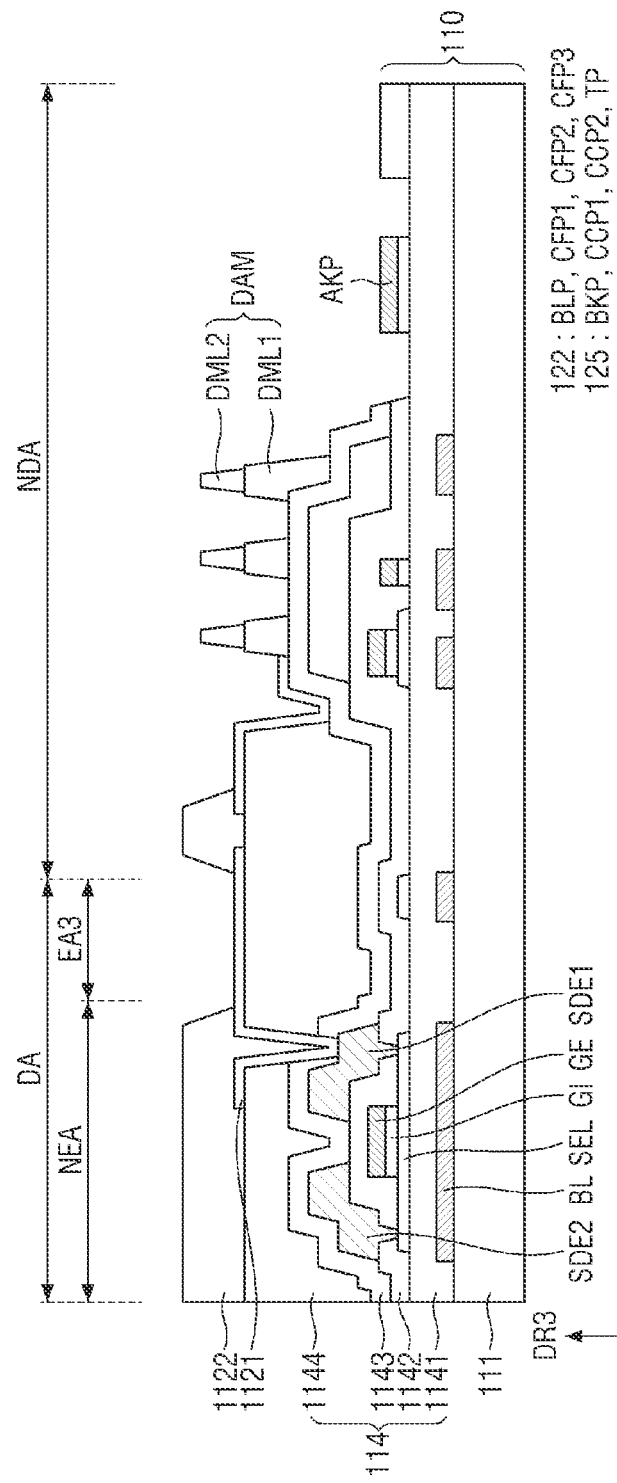
Figure 16:
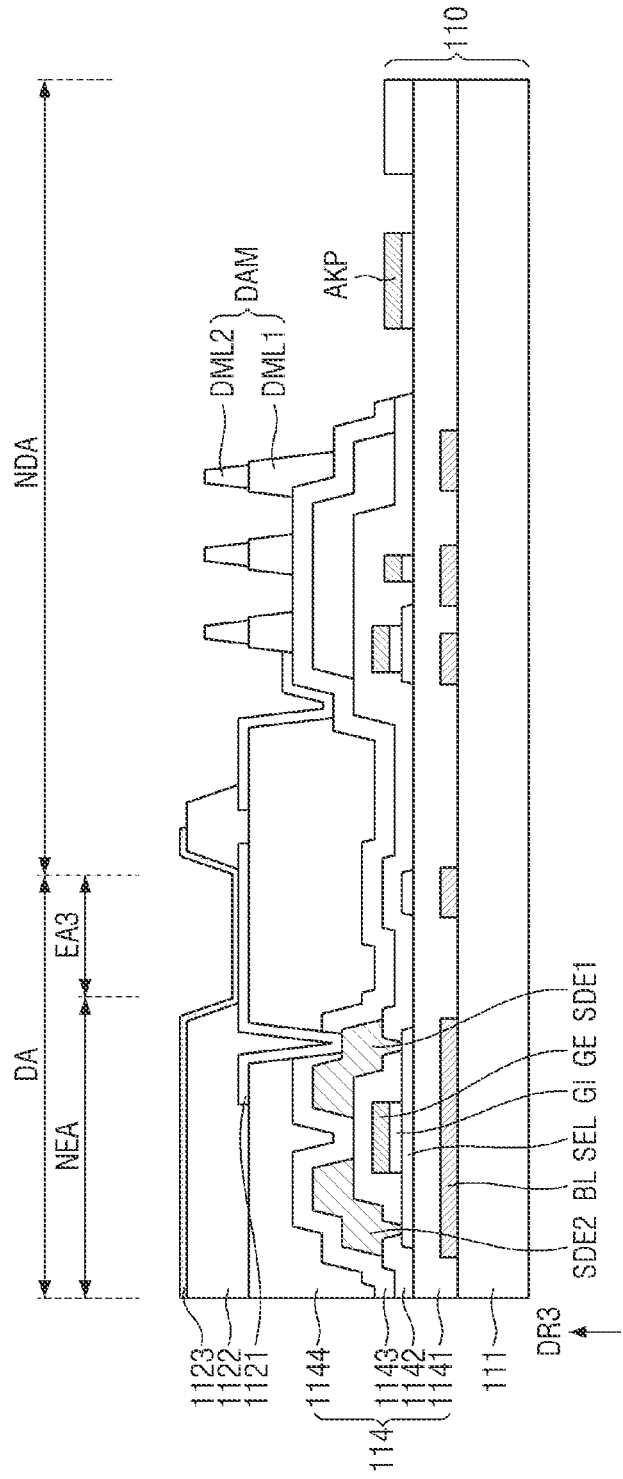
Figure 17:
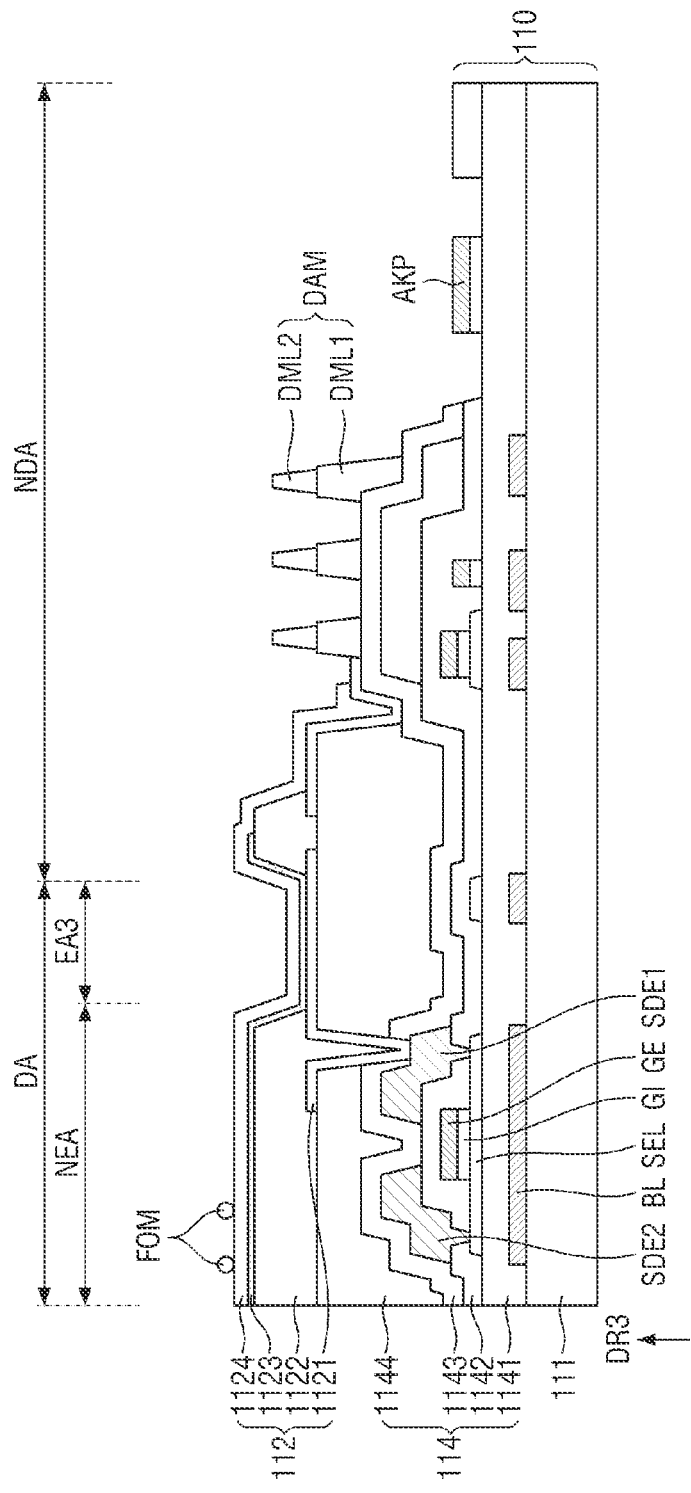

Referring to FIGS. 14, 15, 16 and 17, the step S13 of disposing the light-emitting element layer 112 may include disposing an anode electrode 1121 disposed in each of the emission areas EA on the circuit layer 114 (see FIG. 14); disposing a pixel-defining layer 1122 around each of the emission areas EA on the circuit layer 114 (see FIG. 15); disposing the light-emitting element layer 1123 on the anode electrode 1121 and the pixel-defining layer 1122 (see FIG. 16); and disposing a cathode electrode 1124 on the light-emitting element layer 1123 (see FIG. 17).

Figure 14:
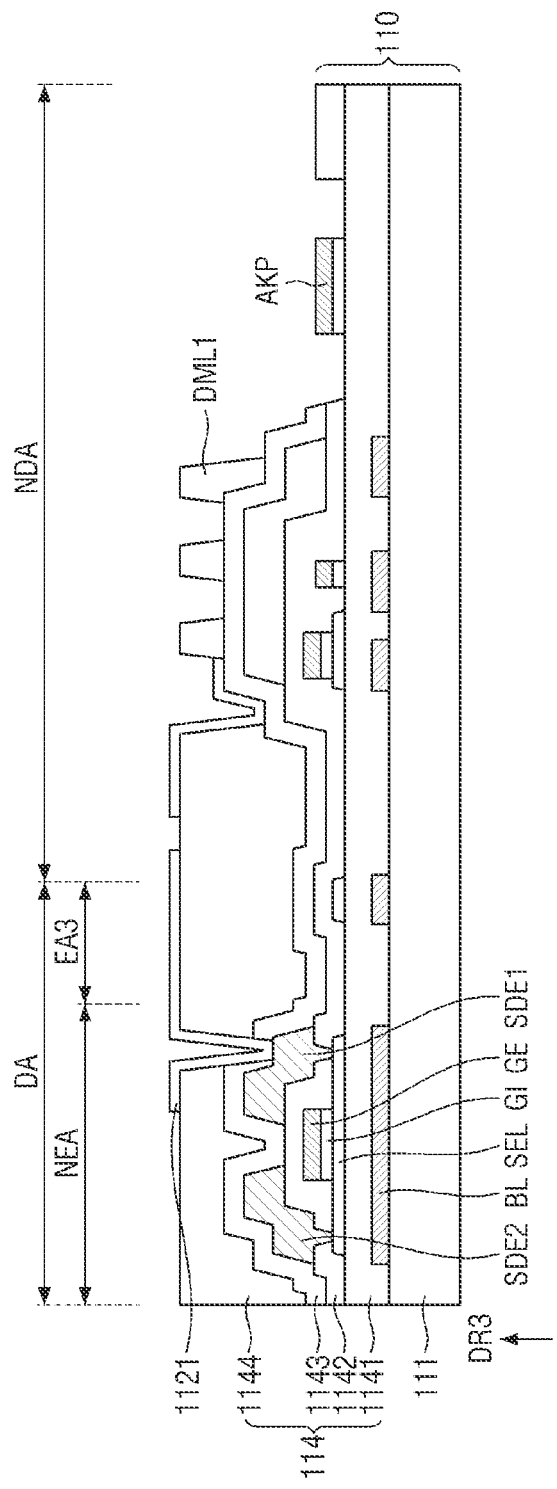

As shown in FIG. 14, before disposing the anode electrode 1121, a hole penetrating through the planarization layer 1144 and the auxiliary insulating layer 1143 and exposing a part of the first electrode SDE1 of the driving transistor DTR may be formed. In addition, one or more first dam layers DML1 made of the same layer as the planarization layer 1144 and disposed in the non-display area NDA may be prepared.

One or more first dam layers DML1 may be disposed to sequentially surround edge of the display area DA.

The anode electrode 1121 may be a pixel electrode disposed in each of the emission areas EA. The anode electrode 1121 may be disposed on the planarization layer 1144, and may be electrically connected to the first electrode SDE1 of the driving transistor DTR through the hole penetrating through the planarization layer 1144 and the auxiliary insulating layer 1143.

As shown in FIG. 15, the pixel-defining layer 1122 is disposed on the planarization layer 1144 in line with the non-emission area NEA, and covers the edge of the anode electrode 1121.

In addition, a second dam layer DML2 disposed on the first dam layer DML1 and formed of the same layer as the pixel-defining layer 1122 may be prepared.

Accordingly, one or more dams DAM each including the first dam layer DML1 and the second dam layer DML2 are prepared, so that the dam portion DAMP may be disposed in the non-display area NDA.

As shown in FIG. 16, the emissive layer 1123 may be disposed on the anode electrode 1121 and the pixel-defining layer 1122 and may be disposed in the emission areas EA.

In other words, the same emissive layer 1123 may be disposed in each of the first emission area EA1, the second emission area EA2 and the third emission area EA3.

The emissive layer 1123 may emit light of the third color in the shortest wavelength range among the first color, the second color and the third color.

As shown in FIG. 17, the cathode electrode 1124 may be a common electrode commonly extended across the emission areas EA. The cathode electrode 1124 may be disposed on the emission layer 1123.

In this manner, the light-emitting element layer 112 may be prepared, which includes the light-emitting elements LEL disposed in each of the emission areas EA and each having the structure in which the emissive layer 1123 is interposed between the anode electrode 1121 and the cathode electrode 1123.

Figure 18:
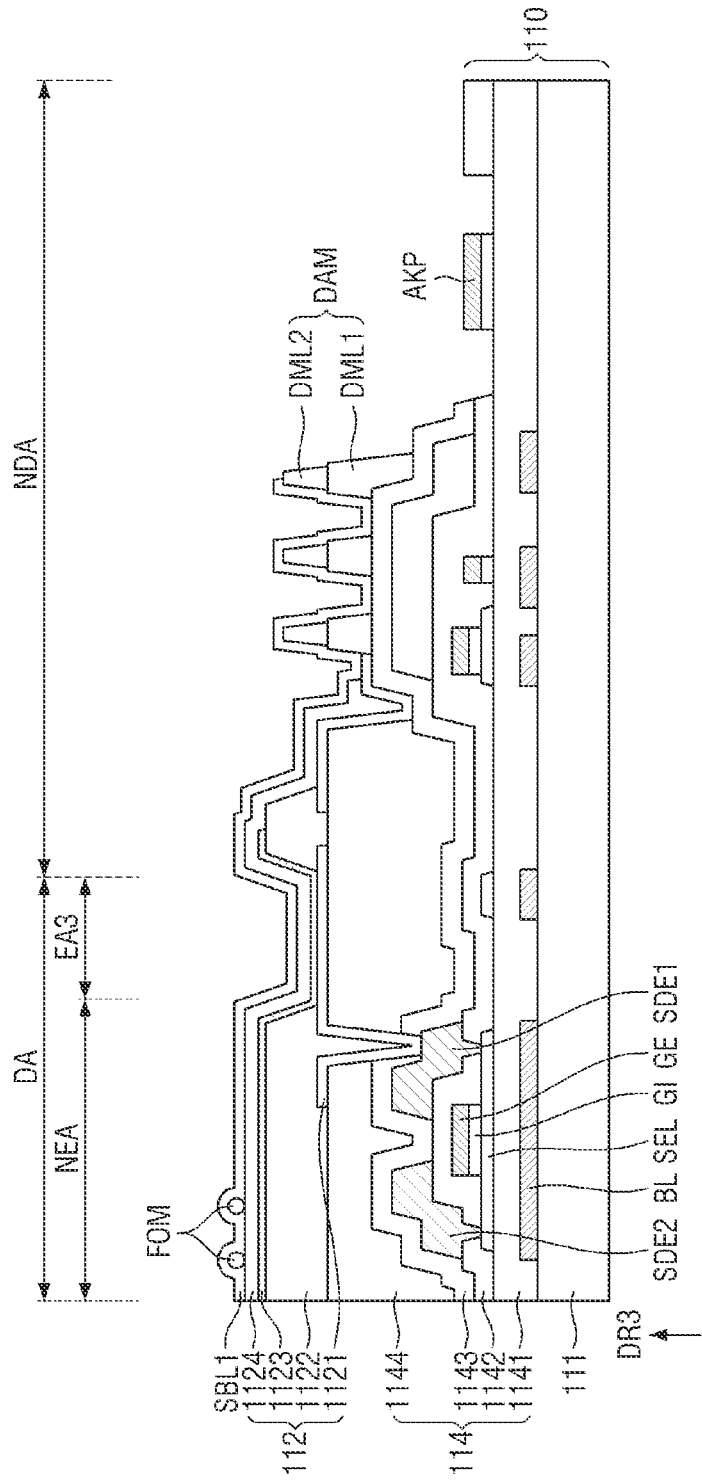

Referring to FIG. 18, a first sub-layer SBL1 covering the light-emitting element layer 112 may be disposed by stacking an inorganic insulating material on the light-emitting element layer 112 (step S14). The first sub-layer SBL1 may be disposed in the display area DA and may extend to the dam portion DAMP. For example, the first sub-layer SBL1 may contact the light-emitting element layer 112.

Figure 19:
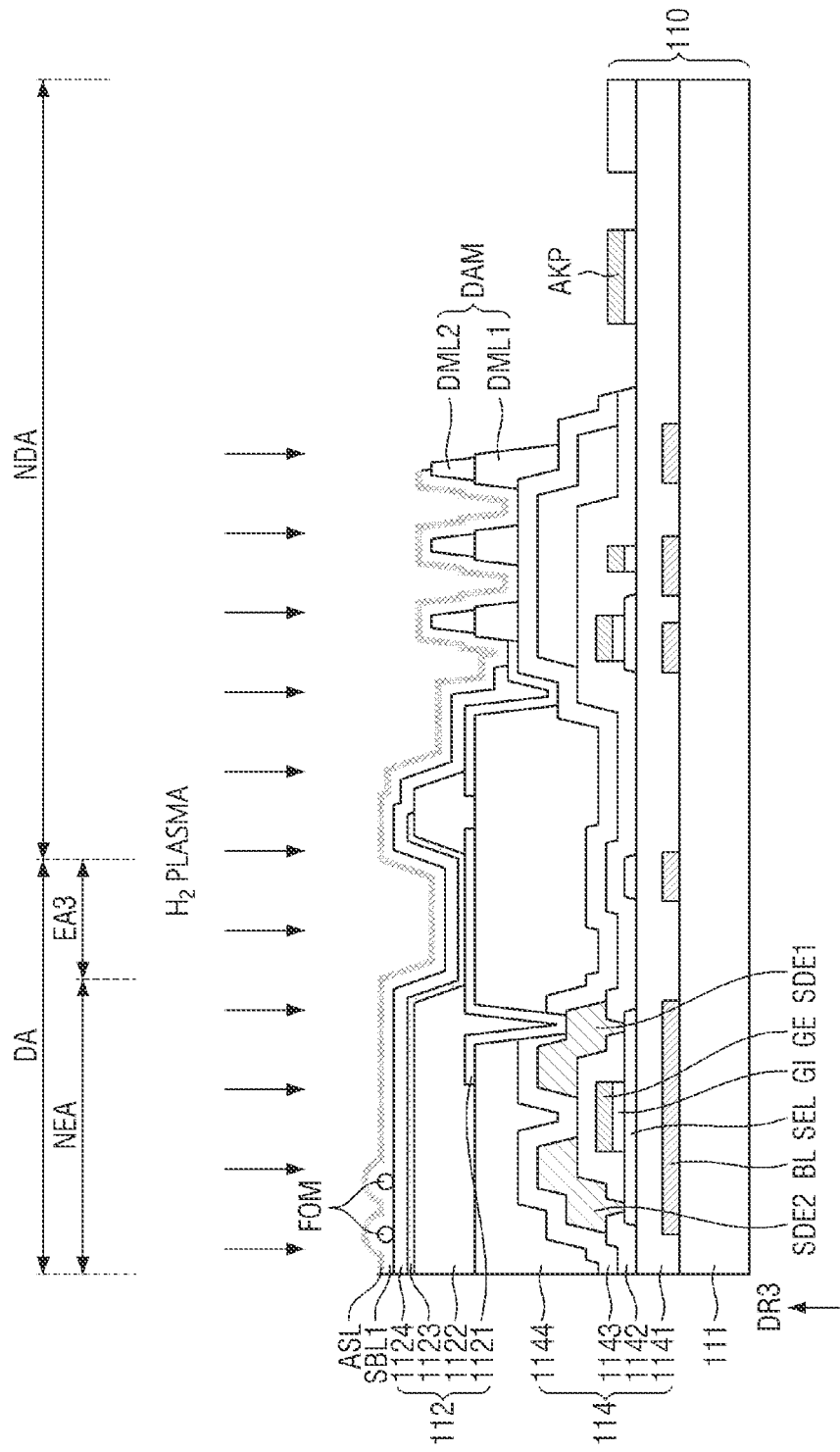

Referring to FIG. 19, hydrogen (H 2) plasma treatment may be carried out on the surface of the first sub-layer SBL1 so that an assisting layer ASL may be disposed on the first sub-layer SBL1 (step S15). For example, the assisting layer ASL may be formed of a part of the first sub-layer SBL1 which has been subjected to the hydrogen (H 2) plasma treatment. The assisting layer ASL may be made of an inorganic insulating material containing a greater content of hydrogen (H 2) than that of the first sub-layer SBL1 by the hydrogen (H 2) plasma treatment. In some embodiments, the assisting layer ASL may be a surface layer of the first sub-layer SBL1 on which hydrogen atoms are attached to remove dangling bonds of the first sub-layer SBL1. In some embodiments, the assisting layer ASL may include a portion of the first sub-layer SBL1 that is doped with or contains hydrogen atoms. For example, in a thickness direction, the portion of the first sub-layer SBL1 may be converted into the assisting layer ASL using the hydrogen plasma treatment.

Figure 20:
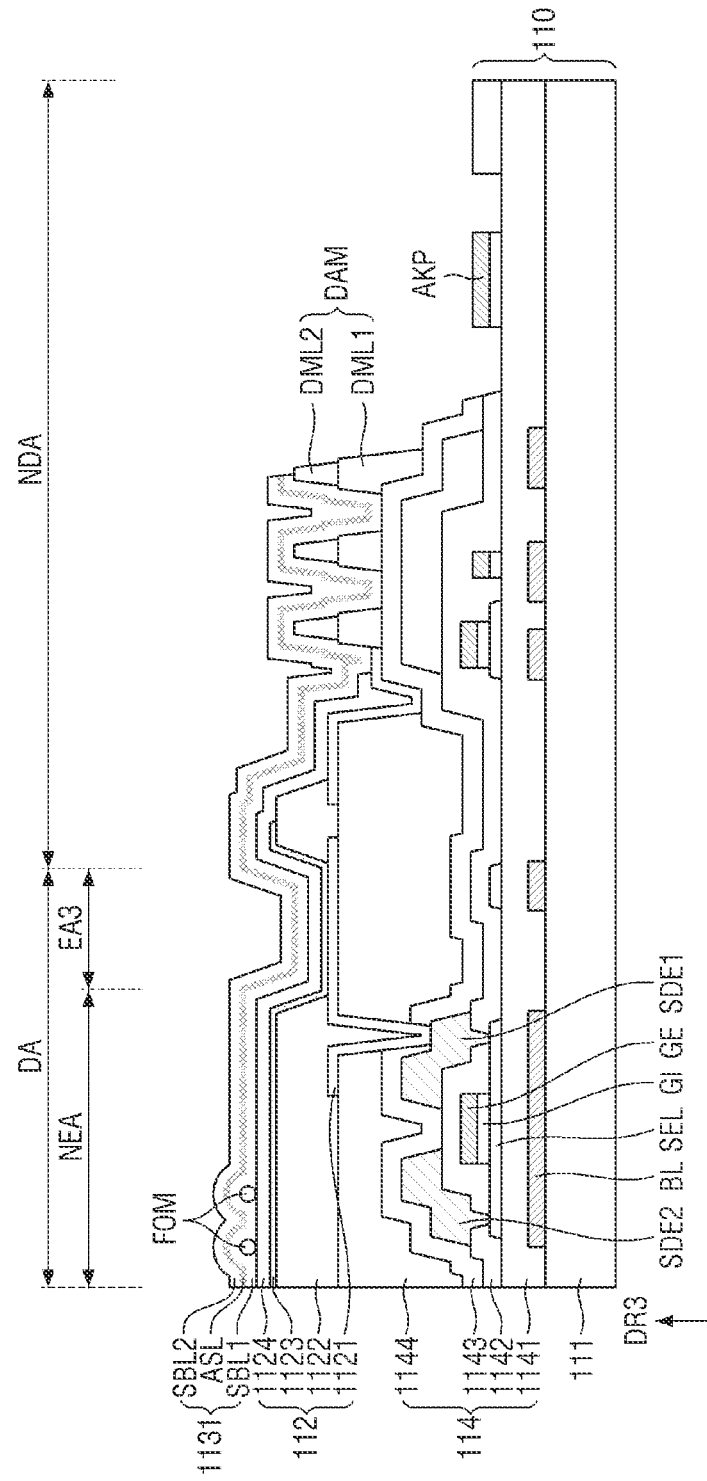

Referring to FIG. 20, by stacking an inorganic insulating material on the assisting layer ASL, a second sub-layer SBL2 may be disposed on the assisting layer ASL (step S16).

Since the second sub-layer SBL2 is not exposed to the hydrogen (H 2) plasma treatment, the assisting layer ASL may contain a greater content of hydrogen (H 2) than the second sub-layer SBL2.

In this manner, the first inorganic layer 1131 including the first sub-layer SBL1, the assisting layer ASL and the second sub-layer SBL2 may be prepared.

Incidentally, foreign matters FOM may remain on the light-emitting element layer 112.

Such remaining foreign matters FOM may cause damage to the light-emitting element LE, such as a disconnection defect of the cathode electrode 1124 or the emissive layer 1123, and a short circuit defect between the cathode electrode 1124 and the anode electrode 1121.

In addition, the remaining foreign matters FOM may be more firmly adhered by the first inorganic layer 1131 covering the light-emitting element layer 112. For example, as the first inorganic layer 1131 is thicker, the adhesive force for fixing the foreign matters FOM may be increased.

Accordingly, according to an embodiment, in order to prevent the strength of the adhesion of the foreign matter FOM from increasing, the thickness TH1 of the first inorganic layer 1131 is limited to approximately 0.3 μm or less.

In addition, the thickness TH1 of the first inorganic layer 1131 may be equal to or greater than approximately 0.05 μm in order to maintain the function of blocking oxygen and/or moisture by the first inorganic layer 1131.

In addition, the first inorganic layer 1131 includes the assisting layer ASL having relatively strong hydrophobicity due to a relatively high content of hydrogen (H). Accordingly, the function of blocking oxygen and/or moisture by the first inorganic layer 1131 can be maintained by virtue of the assisting layer ASL even though the first inorganic layer 1131 has a relatively small thickness TH1 of approximately 0.3 μm or less.

As described above, as the first inorganic layer 1131 has a relatively small thickness TH1 of approximately 0.3 μm or less, the foreign matters FOM remaining on the light-emitting element layer 112 may be fixed on the light-emitting element layer 1123 with has a relatively weak adhesive force.

Therefore, in the step S17 of removing the foreign matters FOM after the steps S14, S15 and S16 of disposing of the first inorganic layer 1131, the foreign matters FOM can be removed relatively easily.

Figure 21:
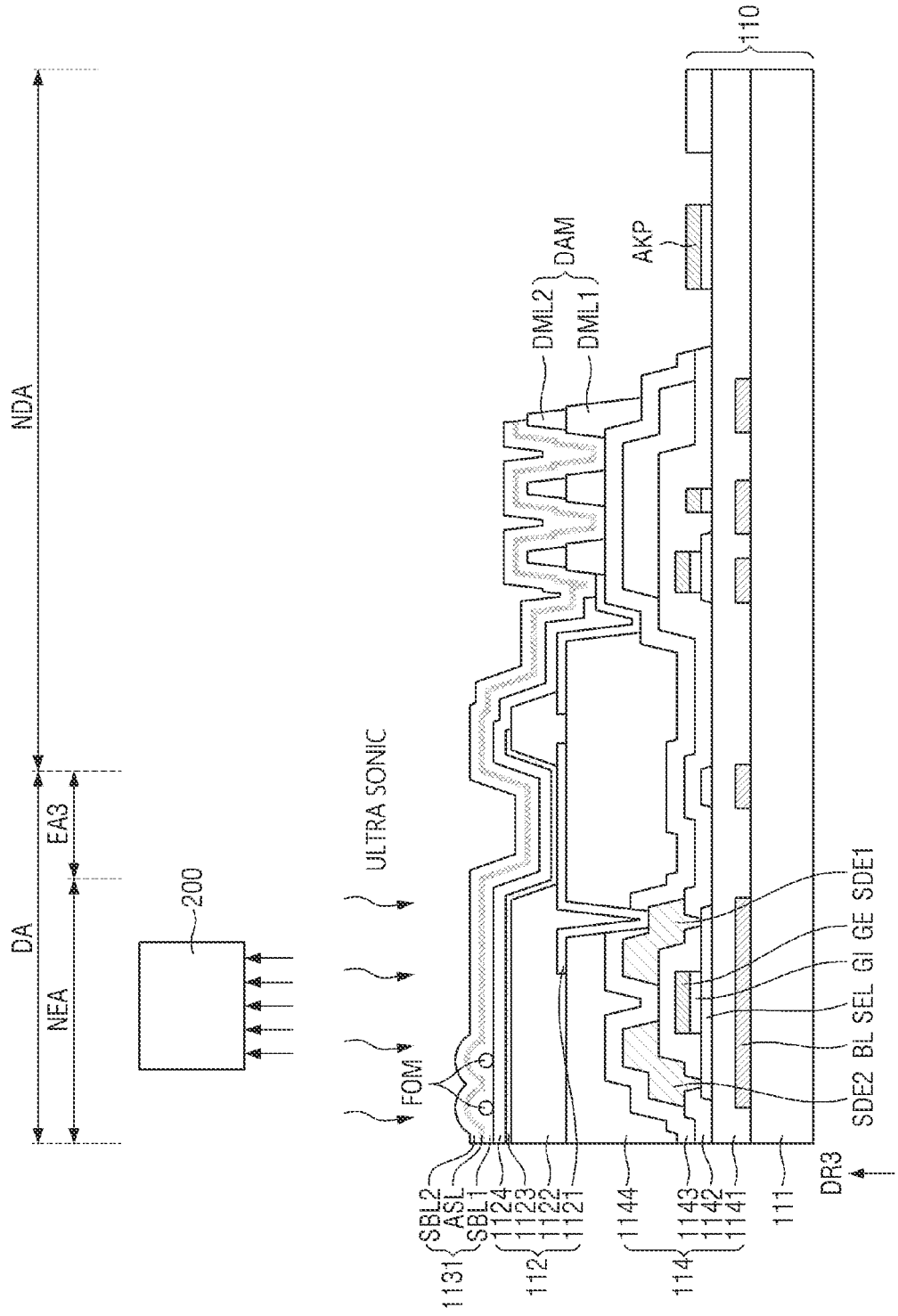

For example, as shown in FIG. 21, the step S17 of removing the foreign matters FOM may include applying a physical impact using an ultrasonic wave to separate the foreign matters FOM from the light-emitting element layer 112, and then removing the separated foreign matters FOM by using a vacuum suction device 200.

Figure 22:
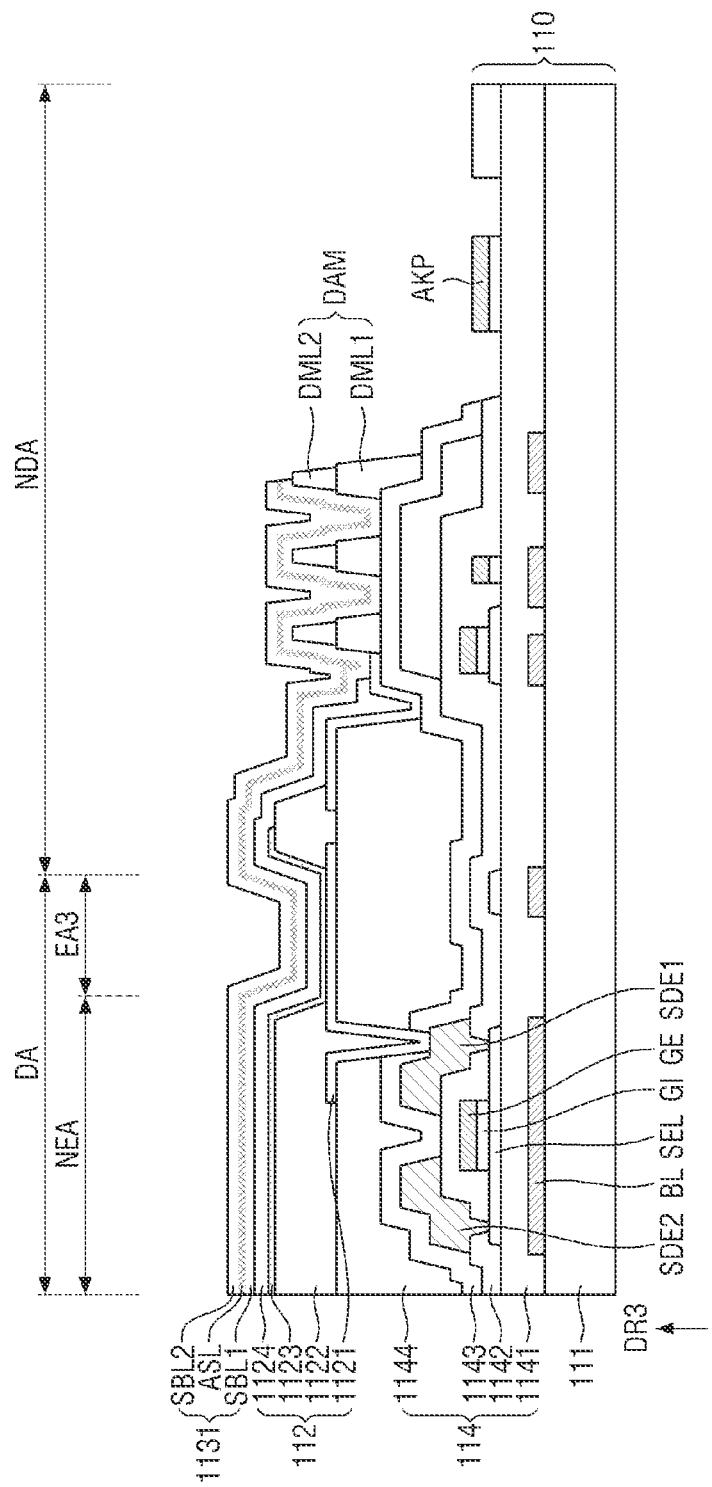

By doing so, as shown in FIG. 22, the foreign matter FOM on the light-emitting element layer 112 can be reduced.

At this time, as the thickness TH1 of the first inorganic layer 1131 is relatively small, the adhesive strength of the foreign matters FOM is relatively small. Therefore, the foreign matters FOM can be removed more even though the same intensity of ultrasonic wave is applied.

Therefore, after the step S17 of removing the foreign matters FOM, the residual amount of the foreign matters FOM can be further reduced, while the light-emitting element layer 112 is less damaged in the step S17 of removing the foreign matters FOM.

Figure 23:
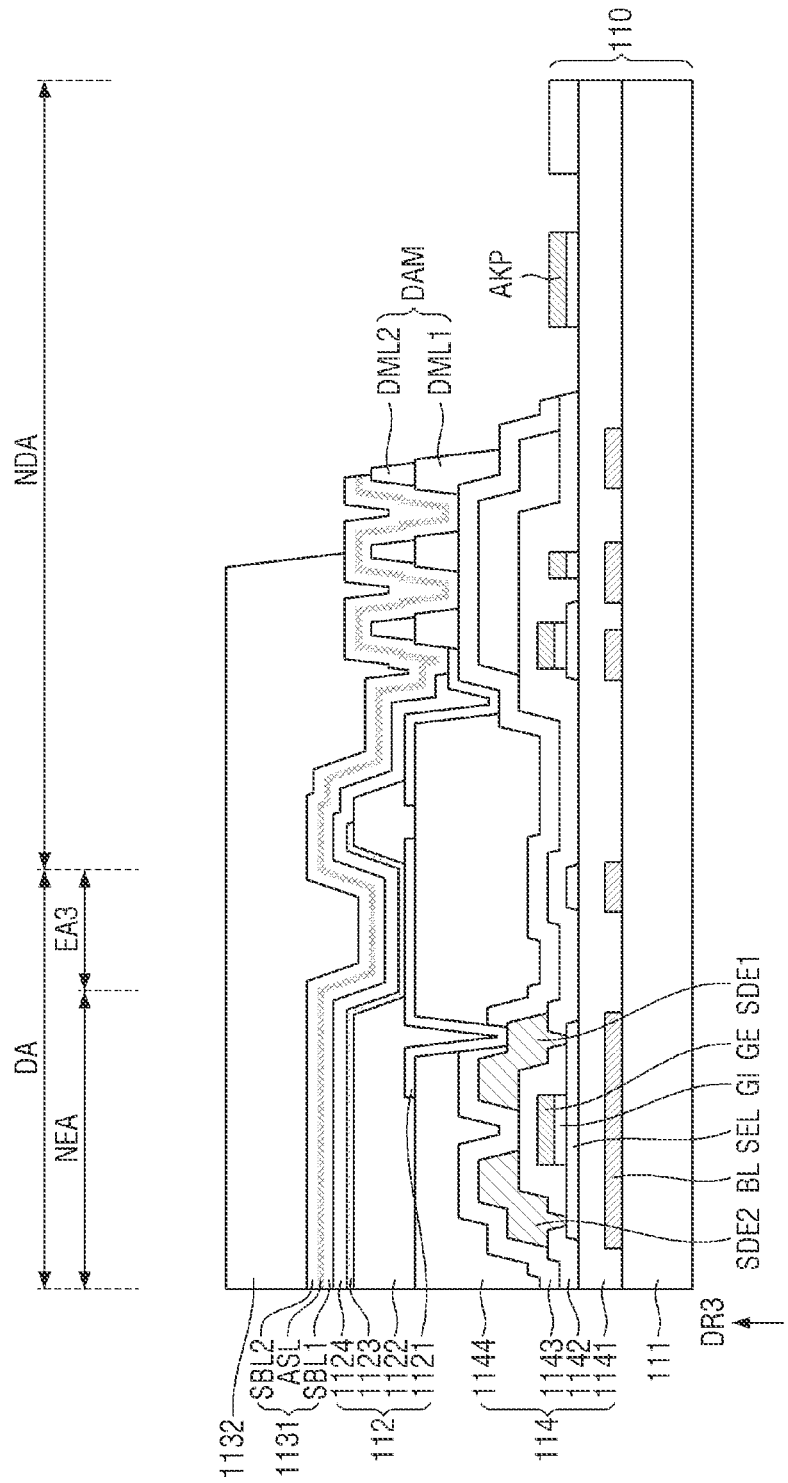

Referring to FIG. 23, after the liquid organic insulating material dropped onto the first inorganic layer 1131 is widely diffused in the display area DA, the organic insulating material is cured, and an organic layer 1132 overlapping with the light-emitting element layer 112 may be disposed on the first inorganic layer 1131 (step S18).

The diffusion of the liquid organic insulating material may be limited by the dam portion DAMP, and thus the organic layer 1132 may be disposed in a region surrounded by the dam portion DAMP.

The thickness TH2 of the organic layer 1132 may range from approximately 2.0 µm to approximately 4.0 µm, which is relatively large, in order to prevent the function of mitigating a physical impact by the encapsulation layer 113 from being deteriorated since the thickness TH1 of the first inorganic layer 1131 is relatively small.

Figure 24:
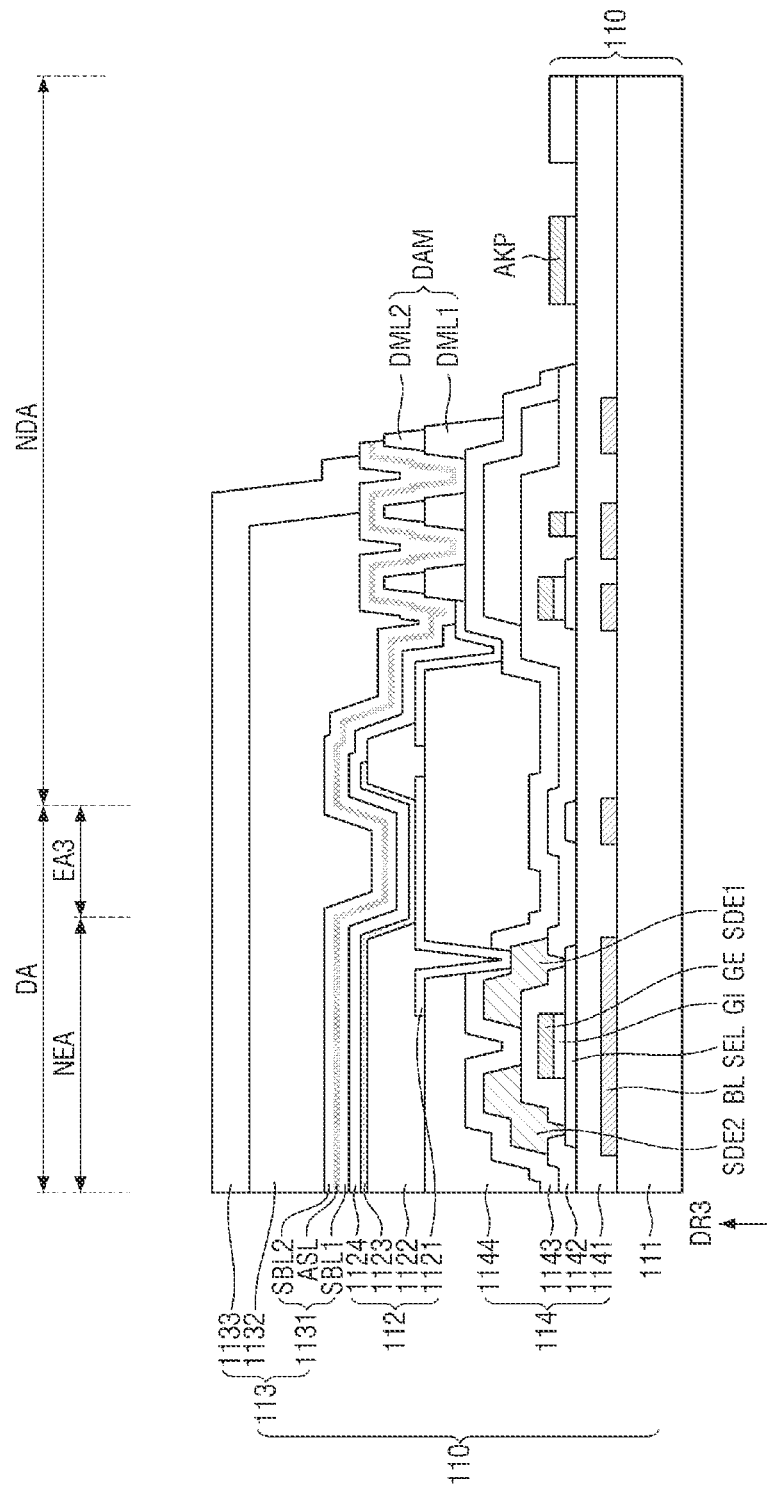

Referring to FIG. 24, by stacking an inorganic insulating material on the organic layer 1132, a second inorganic layer 1133 covering the organic layer 1132 may be disposed on the first inorganic layer 1131 (step S19).

The thickness TH3 of the second inorganic layer 1133 may range from approximately 0.7 µm to approximately 1.2 µm, which is larger than that of the first inorganic layer 1131 in order to prevent the function of blocking moisture and/or oxygen by the encapsulation layer 113 from being deteriorated since the thickness TH1 of the first inorganic layer 1131 is relatively small.

In this manner, the first substrate 110 including the support substrate 111, the circuit layer 114, the light-emitting element layer 112 and the encapsulation layer 113 is prepared (step S10).

Figure 25:
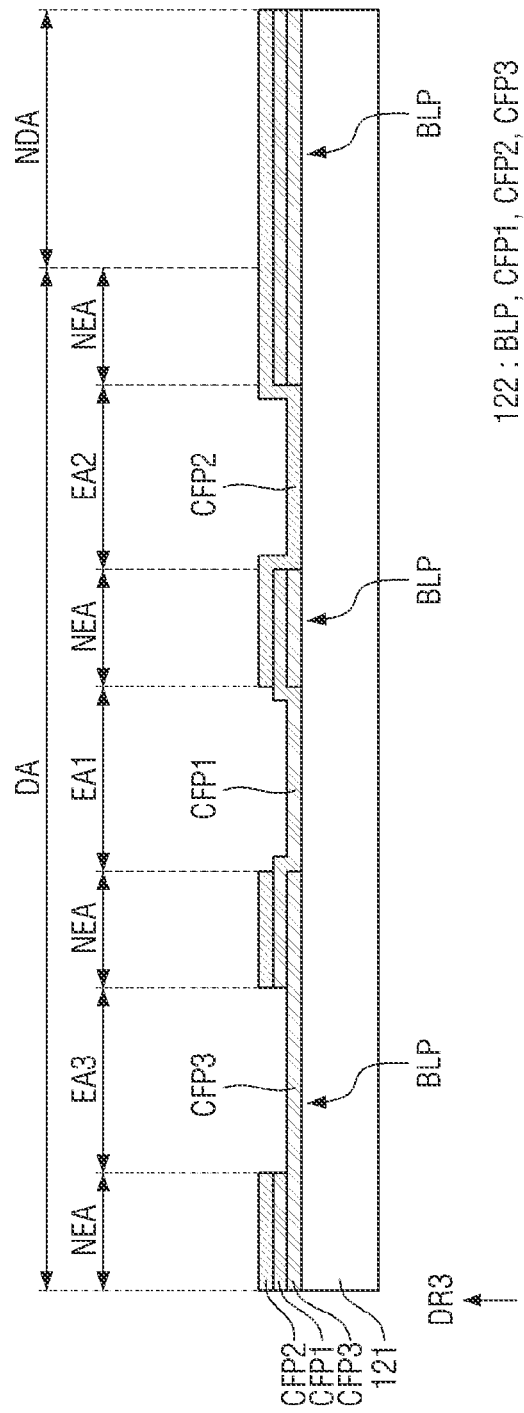

Referring to FIG. 25, an encapsulation substrate 121 including a display area DA and a non-display area NDA may be prepared (step S21).

Subsequently, a color filter layer 122 may be disposed on one surface of the encapsulation substrate 121 (step S22).

As shown in FIG. 4, the color filter layer 4 may include a light-blocking portion BLP disposed around each of the emission areas EA; a first color filter portion CFP1 disposed in the first emission area EA1 and transmitting light of a first color; a second color filter portion CFP2 disposed in the second emission area EA2 and transmitting light of a second color; and a third color filter portion CFP3 disposed in the third emission area EA3 and transmitting light of a third color.

The light-blocking portion BLP may be implemented by stacking the first color filter portion CFP1, the second color filter portion CFP2 and the third color filter portion CFP3 and can block light.

The light-blocking portion BLP may be extended to the non-display area NDA.

Figure 26:
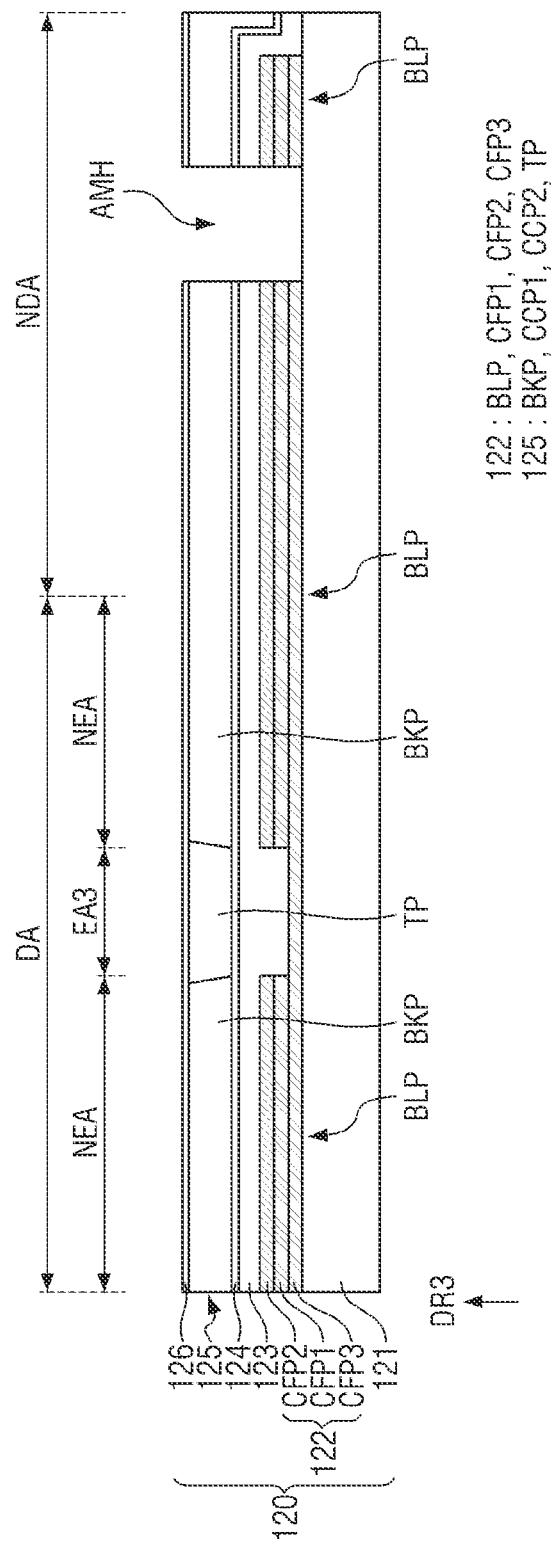

Referring to FIG. 26, a low-refractive layer 123 may be disposed on the color filter layer 122 (step S23). In addition, a first capping layer 124 covering the color filter layer 122 may be disposed on the low-refractive layer 123 (step S24).

Subsequently, a color conversion layer 125 may be disposed on the first capping layer 124 (step S25).

As shown in FIG. 4, the color conversion layer 125 may include a bank portion BKP disposed around each of the emission areas EA; a first color conversion portion CCP1 disposed in the first emission area EA1 and converting the light of the third color emitted from the light-emitting elements LE in the first emission area EA1 into light of the first color; a second color conversion portion CCP2 disposed in the second emission area EA2 and converting the light of the third color emitted from the light-emitting elements LE in the second emission area EA2 into light of the second color; and a transparent portion TP disposed in the third emission area EA3 and transmitting the light of the third color emitted from the light-emitting elements LE in the third light-emitting area EA3.

The bank portion BKP may be extended to the non-display area NDA.

Subsequently, a second capping layer 126 covering the color conversion layer 125 may be disposed (step S26).

Subsequently, an alignment hole AMH penetrating through the second capping layer 126, the color conversion layer 125, the first capping layer 124, the low-refractive layer 123 and the color filter layer 122 may be formed.

Accordingly, the second substrate 120 including the encapsulation substrate 121, the color filter layer 122, the low-refractive layer 123, the first capping layer 124, the color conversion layer 125 and the second capping layer 126 may be prepared (step S20).

Figure 27:
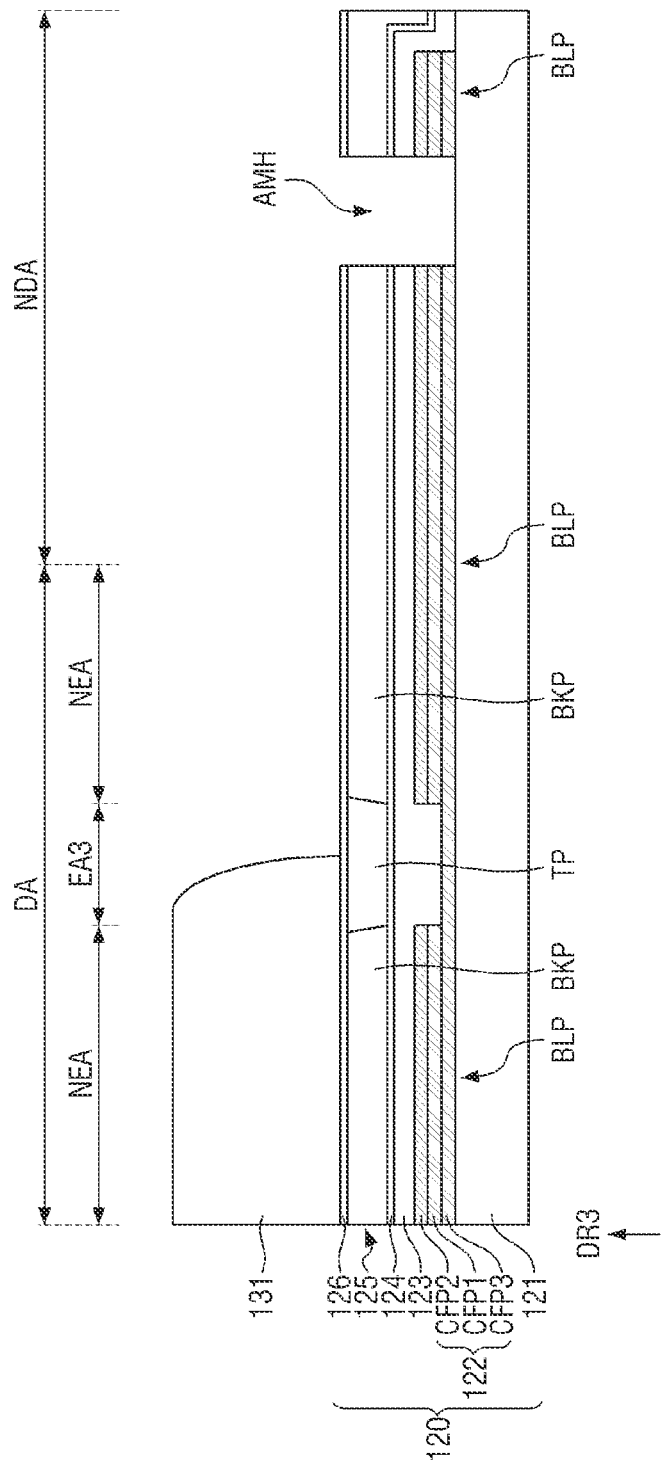

Referring to FIG. 27, a filling material 131 may be dropped one or more times onto the display area DA of the second substrate 120 (step S30).

The amount of the filling material 131 dropped onto the second substrate 120 may be proportional to a distance between the first substrate 110 and the second substrate 120 and the width of the display area DA.

Figure 28:
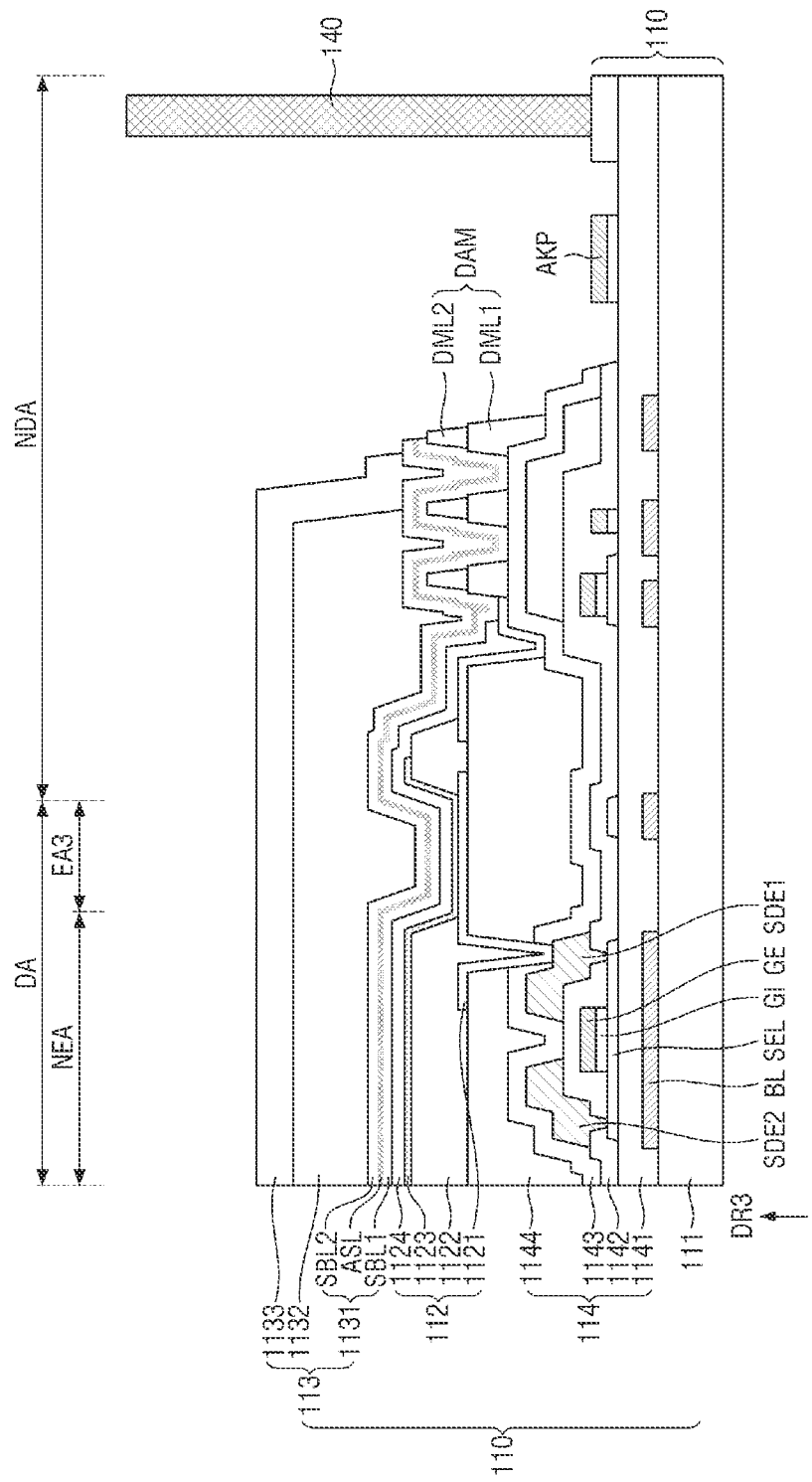

Referring to FIG. 28, a sealing layer 140 may be disposed on at least one of the first substrate 110 and the second substrate 120 (step S40).

The sealing layer 140 may have a frame shape that is adjacent to the edge of the support substrate 111 or the edge of the encapsulation substrate 121 and surrounds the edge of the display area DA.

Figure 29:
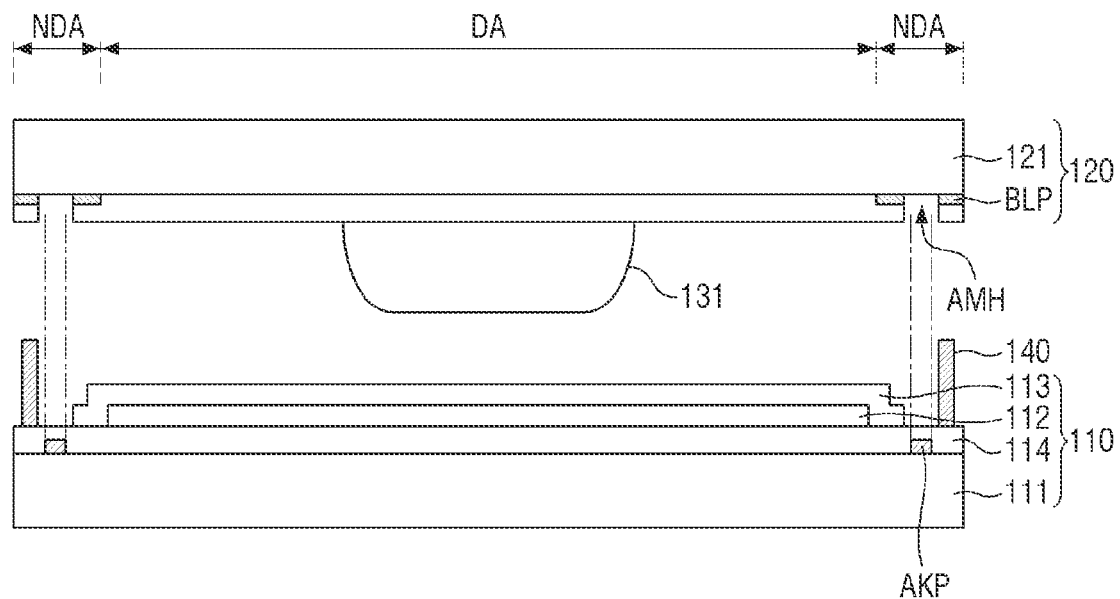

Referring to FIG. 29, the first substrate 110 and the second substrate 120 may be aligned such that they face each other using the alignment key AKP of the first substrate 110 and the alignment hole AMH of the second substrate 120 (step S50).

At this time, it is possible to check whether the first substrate 110 and the second substrate 120 are properly aligned based on whether the alignment key AKP is normally seen through the alignment hole AMH.

Figure 30:
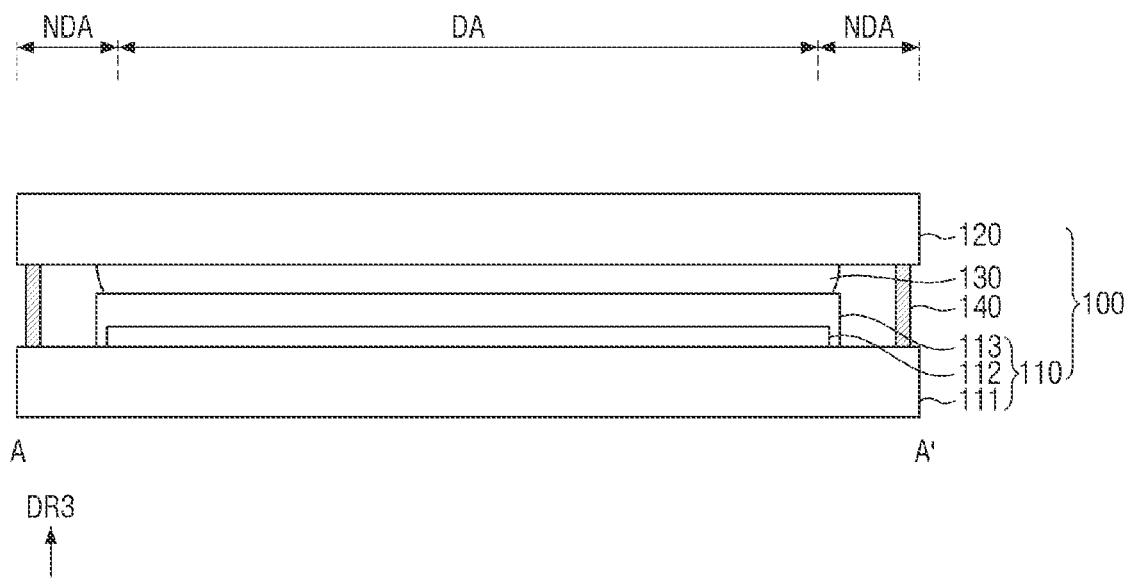

Referring to FIG. 30, the first substrate 110 and the second substrate 120 may be attached together using the sealing layer 140 (step S60).

However, the effects of the present disclosure are not restricted to the one set forth herein. The above and other effects of the present disclosure will become more apparent to an ordinary skilled person in the art to which the present disclosure pertains by referencing the claims.

The invention claimed is:

1. A display device comprising:
a first substrate and a second substrate facing each other; and
a filling layer disposed between the first substrate and the second substrate,
wherein the first substrate comprises:
 a support substrate comprising a display area in which emission areas associated with sub-pixels, respectively, are arranged;
 a light-emitting element layer disposed on one surface of the support substrate and comprising light-emitting elements respectively disposed in the emission areas; and
 an encapsulation layer disposed on the light-emitting element layer,
wherein the encapsulation layer comprises:
 a first inorganic layer disposed on the light-emitting element layer, covering the light-emitting element layer and comprising a first inorganic insulating material;
 an organic layer disposed on the first inorganic layer, overlapping the light-emitting element layer, and comprising an organic insulating material; and
 a second inorganic layer disposed on the first inorganic layer, covering the organic layer, and comprising a second inorganic insulating material,
wherein a portion of the second inorganic insulating material contains hydrogen atoms, and
wherein a thickness of the first inorganic layer is smaller than a thickness of the second inorganic layer, and
wherein the first inorganic insulating material and the second inorganic insulating material are the same in kind.

2. The display device of claim 1,
wherein the thickness of the first inorganic layer is equal to or less than approximately 0.3 µm, and
wherein the thickness of the second inorganic layer is selected from a range of approximately 0.7 µm to approximately 1.2 µm.

3. The display device of claim 2,
wherein the first inorganic layer comprises:
 a first sub-layer disposed on the light-emitting element layer;
 an assisting layer disposed on the first sub-layer; and
 a second sub-layer disposed on the assisting layer, and
wherein the first sub-layer, the assisting layer, and the second sub-layer include the second inorganic insulating material,
wherein the portion of the second inorganic insulating material corresponds to the assisting layer,
wherein the second inorganic insulating material of the assisting layer contains the hydrogen atoms, and
wherein a number of hydrogen (H) atoms in the assisting layer is greater than each of the first sub-layer and the second sub-layer.

4. The display device of claim 3,
wherein the thickness of the first inorganic layer is equal to or greater than approximately 0.05 µm.

5. The display device of claim 3,
wherein a thickness of the organic layer is selected from a range of approximately 2.0 µm to approximately 4.0 µm.

6. The display device of claim 5,
wherein the filling layer overlaps at least the display area, and
wherein a thickness of the filling layer is selected from a range of approximately 4 µm to approximately 5 µm.

7. The display device of claim 3, further comprising:
a sealing layer for attaching the first substrate to the second substrate,
wherein the sealing layer is disposed between the first substrate and the second substrate, is disposed on a non-display area of the support substrate surrounding the display area, and is spaced apart from the filling layer.

8. The display device of claim 2,
wherein the emission areas comprise:
 a first emission area emitting light of a first color in a first wavelength range:
 a second emission area emitting light of a second color in a second wavelength range lower than the first wavelength range of the first color; and
 a third emission area emitting light of a third color in a third wavelength range lower than the second wavelength range of the second color,
wherein the light-emitting element layer comprises:
 an anode electrode disposed in each of the emission areas;
 a pixel-defining layer disposed around each of the emission areas;
 an emissive layer disposed on the anode electrode and the pixel-defining layer; and
 a cathode electrode disposed on the emissive layer,
wherein in each of the light-emitting elements, the emissive layer is interposed between the anode electrode and the cathode electrode facing each other, and
wherein each of the light-emitting elements emits light of the third color.

9. The display device of claim 8,
wherein the second substrate comprises:
 an encapsulation substrate facing the support substrate that includes the display area;
 a color filter layer disposed on one surface of the encapsulation substrate;
 a first capping layer covering the color filter layer;
 a color conversion layer disposed on the first capping layer;
 a second capping layer covering the color conversion layer; and
 a low-refractive layer disposed between the color filter layer and the color conversion layer and comprising a material having a lower refractive index than a lower refractive index of the color conversion layer.

10. The display device of claim 9,
wherein the color conversion layer comprises:
 a bank portion disposed around each of the emission areas;
 a first color conversion portion disposed in the first emission area and converting light of the third color emitted from the light-emitting elements of the first emission area into light of the first color;
 a second color conversion portion disposed in the second emission area and converting light of the third color emitted from the light-emitting elements of the second emission area into light of the second color; and a transparent portion disposed in the third emission area and transmitting light of the third color emitted from the light-emitting elements of the third emission area.

11. The display device of claim 9,
wherein the color filter layer comprises:
a light-blocking portion disposed in a peripheral area between the emission areas;
a first color filter portion disposed in the first emission area and transmitting light of the first color;
a second color filter portion disposed in the second emission area and transmitting light of the second color; and
a third color filter portion disposed in the third emission area and transmitting light of the third color.

12. A method of fabricating a display device, the method comprising:
preparing a first substrate;
preparing a second substrate;
disposing a sealing layer on one of the first substrate and the second substrate;
aligning the first substrate and the second substrate with each other; and
attaching the first substrate to the second substrate using the sealing layer,
wherein the preparing the first substrate comprises:
preparing a support substrate comprising a display area in which emission areas associated with sub-pixels, respectively, are arranged;
disposing a circuit layer comprising pixel drivers associated with the sub-pixels, respectively, on one surface of the support substrate;
disposing a light-emitting element layer on the circuit layer, the light-emitting element layer comprising light-emitting elements disposed in the emission areas, respectively;
disposing a first inorganic layer comprising an inorganic insulating material on the light-emitting element layer;
disposing an organic layer overlapping the light-emitting element layer and comprising an organic insulating material on the first inorganic layer; and
disposing a second inorganic layer covering the organic layer and comprising the inorganic insulating material on the first inorganic layer, and
wherein a thickness of the first inorganic layer is equal to or less than approximately 0.3 μm, and a thickness of the second inorganic layer is selected from a range of approximately 0.7 μm to approximately 1.2 μm.

13. The method of claim 12,
wherein the disposing the first inorganic layer comprises:
disposing a first sub-layer covering the light-emitting element layer;
disposing an assisting layer by performing hydrogen ($H_2$) plasma treatment on a surface of the first sub-layer; and
disposing a second sub-layer on the assisting layer.

14. The method of claim 13,
wherein the assisting layer comprises a greater number of hydrogen (H) atoms than each of the inorganic insulating material of the first sub-layer and the inorganic insulating material of the second sub-layer.

15. The method of claim 13,
wherein the thickness of the first inorganic layer is equal to or greater than approximately 0.05 μm.

16. The method of claim 13,
wherein a thickness of the organic layer is selected from a range of approximately 2.0 μm to approximately 4.0 μm.

17. The method of claim 16, further comprising:
dropping a filling material onto the second substrate prior to the disposing the sealing layer,
wherein the filling material is diffused to overlap at least the display area, thereby forming a filling layer that attaches the first substrate to the second substrate, and
wherein a thickness of the filling layer is selected from a range of approximately 4 μm to approximately 5 μm.

18. The method of claim 13,
wherein the preparing the first substrate further comprises:
removing foreign matters on the light-emitting element layer prior to the disposing the organic layer.

19. The method of claim 13,
wherein the disposing the light-emitting element layer comprises:
disposing an anode electrode in each of the emission areas on the circuit layer;
disposing a pixel-defining layer on the circuit layer around each of the emission areas;
disposing an emissive layer on the anode electrode and the pixel-defining layer; and
disposing a cathode electrode on the emissive layer,
wherein in each of the light-emitting elements, the emissive layer is interposed between the anode electrode and the cathode electrode facing each other,
wherein the emission areas comprise:
a first emission area emitting light of a first color in a first wavelength range;
a second emission area emitting light of a second color in a second wavelength range lower than the first wavelength range of the first color; and
a third emission area emitting light of a third color in a third wavelength range lower than the second wavelength range of the second color, and
wherein each of the light-emitting elements emits light of the third color.

20. The method of claim 19,
wherein the preparing the second substrate comprises:
preparing an encapsulation substrate comprising the display area;
disposing a color filter layer on one surface of the encapsulation substrate;
disposing a first capping layer covering the color filter layer;
disposing a color conversion layer on the first capping layer; and
disposing a second capping layer covering the color conversion layer,
wherein the color filter layer comprises:
a light-blocking portion disposed around each of the emission areas;
a first color filter portion disposed in the first emission area and transmitting light of the first color;
a second color filter portion disposed in the second emission area and transmitting light of the second color; and
a third color filter portion disposed in the third emission area and transmitting light of the third color,
wherein the color conversion layer comprises:
a bank portion disposed around each of the emission areas;

a first color conversion portion disposed in the first emission area and converting light of the third color emitted from the light-emitting elements of the first emission area into light of the first color;

a second color conversion portion disposed in the second emission area and converting light of the third color emitted from the light-emitting elements of the second emission area into light of the second color; and a transparent portion disposed in the third emission area and transmitting light of the third color emitted from the light-emitting elements of the third emission area, and wherein the preparing the second substrate further comprises disposing a low-refractive layer comprising a material having a lower refractive index than that of the color conversion layer between the disposing the color filter layer and the disposing the color conversion layer.

* * * * *